(12) United States Patent
Plihal et al.

(10) Patent No.: US 10,699,926 B2
(45) Date of Patent: Jun. 30, 2020

(54) IDENTIFYING NUISANCES AND DEFECTS OF INTEREST IN DEFECTS DETECTED ON A WAFER

(71) Applicant: KLA-Tencor Corporation, Milpitas, CA (US)

(72) Inventors: Martin Plihal, Pleasanton, CA (US); Brian Duffy, San Jose, CA (US); Mike VonDenHoff, Munich (DE); Andrew Cross, Altrincham (GB); Kaushik Sah, Leuven (BE); Antonio Mani, Leuven (BE)

(73) Assignee: KLA-Tencor Corp., Milpitas, CA (US)

( * ) Notice: Subject to any disclaimer, the term of this patent is extended or adjusted under 35 U.S.C. 154(b) by 10 days.

(21) Appl. No.: 16/113,930

(22) Filed: Aug. 27, 2018

(65) Prior Publication Data

US 2019/0067060 A1 Feb. 28, 2019

Related U.S. Application Data

(60) Provisional application No. 62/551,783, filed on Aug. 30, 2017.

(51) Int. Cl.
*H01L 21/67* (2006.01)
*G06T 7/00* (2017.01)
*G01N 21/95* (2006.01)

(52) U.S. Cl.
CPC ... *H01L 21/67288* (2013.01); *G01N 21/9501* (2013.01); *G06T 7/001* (2013.01);
(Continued)

(58) Field of Classification Search
CPC . H01L 21/67288; G06T 7/0004; G06T 7/001; G06T 7/0006; G06T 2207/10061;
(Continued)

(56) References Cited

U.S. PATENT DOCUMENTS 8,126,255 B2 2/2012 Bhaskar et al.
8,664,594 B1 4/2014 Jiang et al.
(Continued)

FOREIGN PATENT DOCUMENTS

JP 2017-083270 5/2017

OTHER PUBLICATIONS

International Search Report and Written Opinion for PCT/US2018/048546 dated Dec. 13, 2018.
(Continued)

*Primary Examiner* — Thomas C Lee
*Assistant Examiner* — Charles Cai
(74) *Attorney, Agent, or Firm* — Ann Marie Mewherter

(57) ABSTRACT

Methods and systems fir identifying nuisances and defects of interest (DOIs) in defects detected on a wafer are provided. One method includes acquiring metrology data for the wafer generated by a metrology tool that performs measurements on the wafer at an array of measurement points. In one embodiment, the measurement points are determined prior to detecting the defects on the wafer and independently of the defects detected on the wafer. The method also includes determining locations of defects detected on the wafer with respect to locations of the measurement points on the wafer and assigning metrology data to the defects as a defect attribute based on the locations of the defects determined with respect to the locations of the measurement points. In addition, the method includes determining if the defects are nuisances or DOIs based on the defect attributes assigned to the defects.

26 Claims, 6 Drawing Sheets

(52) U.S. Cl.
CPC .......... *G06T 7/0004* (2013.01); *G06T 7/0006* (2013.01); *G06T 2207/10061* (2013.01); *G06T 2207/20081* (2013.01); *G06T 2207/20084* (2013.01); *G06T 2207/30148* (2013.01)

(58) Field of Classification Search
CPC . G06T 2207/20084; G06T 2207/30148; G06T 2207/20081; G01N 21/9501
See application file for complete search history.

(56) References Cited

U.S. PATENT DOCUMENTS

| | | | |
|---|---|---|---|
| 8,692,204 | B2 | 4/2014 | Kojima et al. |
| 8,698,093 | B1 | 4/2014 | Gubbens et al. |
| 8,716,662 | B1 | 5/2014 | MacDonald et al. |
| 9,222,895 | B2 | 12/2015 | Duffy et al. |
| 2002/0161534 | A1* | 10/2002 | Adler .................. G01N 21/956 702/35 |
| 2015/0221076 | A1 | 8/2015 | Gao et al. |
| 2015/0324965 | A1* | 11/2015 | Kulkarni .................. G06T 7/74 382/144 |
| 2015/0332445 | A1 | 11/2015 | Harada et al. |
| 2016/0116420 | A1 | 4/2016 | Duffy et al. |
| 2016/0258879 | A1 | 9/2016 | Liang et al. |
| 2016/0292840 | A1 | 10/2016 | Konecky |
| 2017/0053843 | A1* | 2/2017 | LaRose .................. H01L 22/20 |
| 2017/0140524 | A1 | 5/2017 | Karsenti et al. |
| 2017/0148226 | A1 | 5/2017 | Zhang et al. |
| 2017/0193400 | A1 | 7/2017 | Bhaskar et al. |
| 2017/0193680 | A1 | 7/2017 | Zhang et al. |
| 2017/0194126 | A1 | 7/2017 | Bhaskar et al. |
| 2017/0200260 | A1 | 7/2017 | Bhaskar et al. |
| 2017/0200264 | A1 | 7/2017 | Park et al. |
| 2017/0200265 | A1 | 7/2017 | Bhaskar et al. |
| 2017/0345140 | A1 | 11/2017 | Zhang et al. |
| 2018/0232873 | A1 | 8/2018 | Inoue et al. |
| 2019/0013176 | A1* | 1/2019 | Breuer .................. H01J 37/153 |
| 2019/0139210 | A1* | 5/2019 | Kondo .................... G06T 7/001 |

OTHER PUBLICATIONS

Hand et al., "Principles of Data Mining (Adaptive Computation and Machine Learning)," MIT Press, Aug. 1, 2001, 578 pages.

He et al., "Deep Residual Learning for Image Recognition," arXiv:1512.03385v1, Dec. 10, 2015, 12 pages.

Jebara, "Discriminative, Generative, and Imitative Learning," MIT Thesis, Feb. 2002, 212 pages.

Krizhevsky et al., "ImageNet Classification with Deep Convolutional Neural Networks," NIPS, Jan. 2012, 9 pages.

Shin, "Variation-Aware Advanced CMOS Devices and SRAM," "Chapter 2 Line Edge Roughness (LER)," Springer Series in Advanced Microelectronics 56, Springer Netherlands, Jun. 7, 2016, pp. 19-35.

Simonyan et al., "Very Deep Convolutional Networks for Large-Scale Image Recognition," presented at International Conference on Learning Representations (ICLR) 2015, Apr. 10, 2015, 14 pages.

Sugiyama, "Introduction to Statistical Machine Learning," Morgan Kaufmann, Oct. 9, 2015, 534 pages.

Szegedy et al., "Going Deeper with Convolutions," 2015 IEEE Conference on Computer Vision and Pattern Recognition (CVPR), Jun. 2015, 9 pages.

U.S. Appl. No. 15/697,426, filed Sep. 6, 2017 by He et al. (submitted as U.S. Patent Application Publication No. 2019/0073568 published Mar. 7, 2019).

* cited by examiner

IDENTIFYING NUISANCES AND DEFECTS OF INTEREST IN DEFECTS DETECTED ON A WAFER

BACKGROUND OF THE INVENTION

1. Field of the Invention

This invention generally relates to methods and systems for identifying nuisances and defects of interest in defects detected on a wafer.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

As design rules shrink, however, semiconductor manufacturing processes may be operating closer to the limitations on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically.

Relatively high nuisance rates are a common problem and prevent running hot enough (I.e., into the noise floor) to find substantially small defects. Identifying the nuisance defects is often key to find the right nuisance suppression technique. Scanning electron microscope (SEM) images may be used to correlate optical images to SEM images to find out where the nuisance defects came from, but this is a long and time consuming process. In addition, very often, the nuisance defects are not visible in the SEM images, which makes it impossible to predict in which layer and patterned feature they got introduced. As an alternative, transmission electron microscope (TEM) cross-sectioning of the nuisance defects can be performed, but this is a substantially time consuming technique, and the location of the nuisance defects is substantially hard to find.

Accordingly, it would be advantageous to develop systems and/or methods for identifying nuisances and defects of interest in defects detected on a wafer that do not have one or more of the disadvantages described above.

SUMMARY OF THE INVENTION

The following description of various embodiments is not to be construed in any way as limiting the subject matter of the appended claims.

One embodiment relates to a system configured to identify nuisances and defects of interest (DOIs) in defects detected on a wafer. The system includes an inspection subsystem that includes at least an energy source and a detector. The energy source is configured to generate energy that is directed to a wafer. The detector is configured to detect energy from the wafer and to generate output responsive to the detected energy. The system also includes one or more computer subsystems configured for detecting defects on the wafer by applying a defect detection method to the output, The one or more computer subsystems are also configured for acquiring metrology data for the wafer. The metrology data is generated for the wafer by a metrology tool that performs to measurements on the wafer at an array of measurement points on the wafer. A density of the measurement points on the wafer is less than a density of inspection points on the wafer at which the output is generated by the detector during inspection of the wafer.

The one or more computer subsystems are also configured for determining locations of the defects on the wafer with respect to locations of the measurement points on the wafer. The one or more computer subsystems are further configured for assigning metrology data to the defects as a defect attribute based on the locations of the defects determined with respect to the locations of the measurement points. The assigning includes, for defects detected at the measurement points, assigning the acquired metrology data generated at the measurement points to the defects based on which of the measurement points at which the defects were detected. The assigning also includes, for the defects not detected at any of the measurement points, predicting the metrology data at locations at which the defects were detected from the metrology data generated at the measurement points and the locations of the defects determined with respect to the locations of the measurement points. The one or more computer subsystems are also configured for determining if the defects are nuisances or DOIs based on the defect attributes assigned to the defects. The system may be further configured as described herein.

Another embodiment relates to a computer-implemented method for identifying nuisances and DOIs on a wafer. The method includes detecting defects on the wafer by applying a defect detection method to output generated for the wafer by a detector of an inspection subsystem. The inspection subsystem is configured as described above. The method also includes acquiring metrology data for the wafer. The metrology data is generated as described above. In addition, the method includes determining locations of the defects on the wafer with respect to locations of the measurements points on the wafer. The method further includes assigning metrology data to the defects as a defect attribute based on the locations of the defects determined with respect to the locations of the measurement points. The assigning is performed as described above. The method also includes determining if the defects are nuisances or DOIs based on the defect attributes assigned to the defects. The detecting, acquiring, determining the locations, assigning, and determining if the defects are nuisances or DOIs steps are performed by one or more computer subsystems coupled to the inspection subsystem.

Each of the steps of the method described above may be further performed as described further herein. In addition, the method described above may include any other step(s) of any other method(s) described herein. Furthermore, the method described above may be performed by any of the systems described herein.

An additional embodiment relates to a non-transitory computer-readable medium storing program instructions executable on a computer system for performing a computer-implemented method for identifying nuisances and DOIs in defects detected on a wafer. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
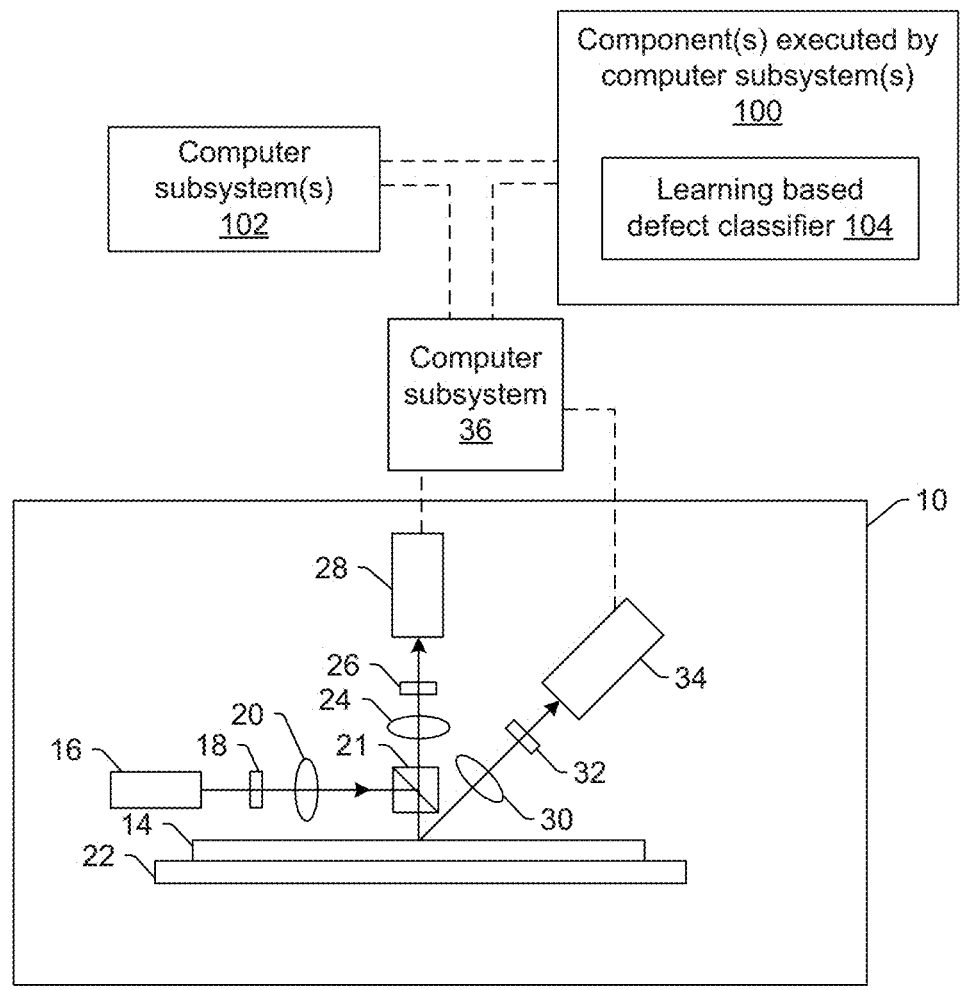
FIGS. 1 and 2 are schematic diagrams illustrating a side view of an embodiment of a system configured as described herein.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured to identify nuisances and defects of interest (DOIs) in defects detected on a wafer. One embodiment of such a system is shown in FIG. 1. The system includes an inspection subsystem that includes at least an energy source and a detector. The energy source is configured to generate energy that is directed to a wafer. The detector is configured to detect energy from the wafer and to generate output responsive to the detected energy. The wafer may include any wafer known in the art.

In one embodiment, the inspection subsystem is configured as an optical inspection subsystem. For example, in the embodiment of the system shown in FIG. 1, inspection subsystem 10 includes an illumination subsystem configured to direct light to wafer 14. The illumination subsystem includes at least one light source. For example, as shown in FIG. 1, the illumination subsystem includes light source 16. In one embodiment, the illumination subsystem is configured to direct the light to the wafer at one or more angles of incidence, which may include one or more oblique angles and/or one or more normal angles. For example, as shown in FIG. 1, light from light source 16 is directed through optical element 18 and then lens 20 to beam splitter 21, which directs the light to wafer 14 at a normal angle of incidence. The angle of incidence may include any suitable angle of incidence, which may vary depending on, for instance, characteristics of the wafer and the defects to be detected on the wafer.

The illumination subsystem may be configured to direct the light to the wafer at different angles of incidence at different times. For example, the inspection subsystem may be configured to alter one or more characteristics of one or more elements of the illumination subsystem such that the light can be directed to the wafer at an angle of incidence that is different than that shown in FIG. 1. In one such example, the inspection subsystem may be configured to move light source 16, optical element 18, and lens 20 such that the light is directed to the wafer at a different angle of incidence.

In some instances, the inspection subsystem may be configured to direct light to the wafer at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the wafer at the same time as the other light, one or more characteristics (e.g., wavelength, polarization, etc.) of the light directed to the wafer at different angles of incidence may be different such that light resulting from illumination of the wafer at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the wafer. Multiple illumination channels may be configured to direct light to the wafer at the same time or at different times (e.g., when different illumination channels are used to sequentially illuminate the wafer). In another instance, the same illumination channel may be configured to direct light to the wafer with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the wafer at different times. The illumination subsystem may have any other suitable configuration known in the art for directing light having different or the same characteristics to the wafer at different or the same angles of incidence sequentially or simultaneously.

In one embodiment, light source 16 may include a broadband plasma (BBP) light source. In this manner, the light generated by the light source and directed to the wafer may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 1 as a single refractive optical element, it is to be understood that, in practice, lens 20 may include a number of refractive and/or reflective optical elements that in combination focus the light from the optical element to the wafer. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for inspection.

The inspection subsystem may also include a scanning subsystem configured to cause the light to be scanned over the wafer. For example, the inspection subsystem may include stage 22 on which wafer 14 is disposed during inspection. The scanning subsystem may include any suitable mechanical and/or robotic assembly (that includes stage 22) that can be configured to move the wafer such that the light can be scanned over the wafer. In addition, or alternatively, the inspection subsystem may be configured such that one or more optical elements of the inspection subsystem perform some scanning of the light over the wafer. The light may be scanned over the wafer in any suitable fashion.

The inspection subsystem further includes one or more detection channels. At least one of the one or more detection channels includes a detector configured to detect light from the wafer due to illumination of the wafer by the inspection subsystem and to generate output responsive to the detected light. For example, the inspection subsystem is shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the wafer. However, two or more of the detection channels may be configured to detect the same type of light from the wafer (e.g., specularly reflected light). Although FIG. 1 shows an embodiment of the inspection subsystem that includes two detection channels, the inspection subsystem may include a different number of detection channels (e.g., only one detection channel or two or more detection channels). Although each of the collectors are shown in FIG. 1 as single refractive optical elements, it is to be understood that each of the collectors may include one or more refractive optical elements) and/or one or more reflective optical element(s).

The one or more detection channels may include any suitable detectors known in the art. For example, the detectors may include photo-multiplier tubes (PMTs), charge coupled devices (CCDs), and time delay integration (TDI) cameras. The detectors may also include any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the inspection subsystem may be signals or data, but not image signals or image data. In such instances, a computer subsystem such as computer subsystem 36 of the system may be configured to generate images of the wafer from the non-imaging output of the detectors. However, in other instances, the detectors may be configured as imaging detectors that are configured to generate imaging signals or image data. Therefore, the system may be configured to generate the output described herein in a number of ways.

It is noted that FIG. 1 is provided herein to generally illustrate a configuration of an inspection subsystem that may be included in the system embodiments described herein. Obviously, the inspection subsystem configuration described herein may be altered to optimize the performance of the system as is normally performed when designing a commercial inspection system. In addition, the systems described herein may be implemented using an existing inspection system (e.g., by adding functionality described herein to an existing inspection system) such as the 29xx and 39xx series of tools that are commercially available from KLA-Tencor, Milpitas, Calif. For some such systems, the methods described herein may be provided as optional functionality of the system (e.g., in addition to other functionality of the system). Alternatively, the system described herein may be designed "from scratch" to provide a completely new system.

Computer subsystem 36 of the system may be coupled to the detectors of the inspection subsystem in any suitable manner (e.g., via one or more transmission media, which may include "wired" and/or "wireless" transmission media) such that the computer subsystem can receive the output generated by the detectors during scanning of the wafer. Computer subsystem 36 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

Figure 2:
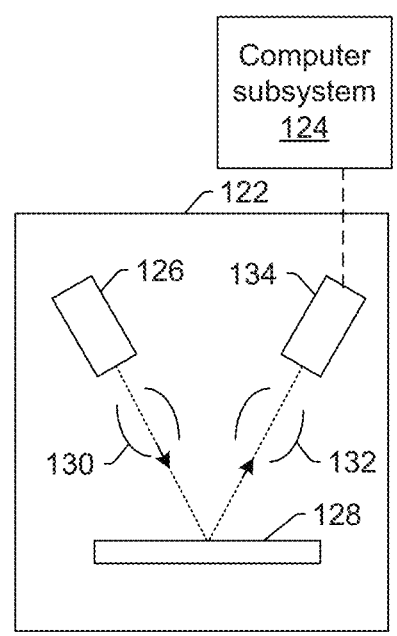

In another embodiment, the inspection subsystem is configured as an electron beam inspection subsystem. In one such embodiment shown in FIG. 2, the electron beam inspection subsystem includes electron column 122, which is coupled to computer subsystem 124. As also shown in FIG. 2, the electron column includes electron beam source 126 configured to generate electrons that are focused to wafer 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective tens, and a scanning subsystem, all of which may include any such suitable elements known in the art.

Electrons returned from the wafer (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al, U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al, which are incorporated by reference as if fully set forth herein.

Although the electron column is shown in FIG. 2 as being configured such that the electrons are directed to the wafer at an oblique angle of incidence and are scattered from the wafer at another oblique angle, it is to be understood that the electron beam may be directed to and scattered from the wafer at any suitable angles. In addition, the electron beam based tool may be configured to use multiple modes to generate images of the wafer with different illumination angles, collection angles, etc.). The multiple modes of the electron beam based tool may be different in any image generation parameters of the tool.

Computer subsystem 124 may be coupled to detector 134 as described above. The detector may detect electrons returned from the surface of the wafer thereby forming electron beam images of the wafer. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the electron beam inspection subsystem shown in FIG. 2 may be further configured as described herein.

It is noted that FIG. 2 is provided herein to generally illustrate a configuration of an electron beam inspection subsystem that may be included in the embodiments described herein. As with the optical inspection subsystem described above, the electron beam inspection subsystem described herein may be altered to optimize the performance of the electron beam inspection subsystem as is normally performed when designing a commercial inspection system. In addition, the systems described herein may be implemented using an existing electron beam inspection system (e.g., by adding functionality described herein to an existing electron beam inspection system). For some such systems, the methods described herein may be provided as optional functionality of the system (e.g., in addition to other functionality of the system). Alternatively, the system described herein may be designed "from scratch" to provide a completely new system.

Although the inspection subsystem is described above as being an optical or electron inspection subsystem, the inspection subsystem may be an ion beam inspection subsystem. Such an inspection subsystem may be configured as shown in FIG. 2 except that the electron beam source may be replaced with any suitable ion beam source known in the art. In addition, the inspection subsystem may be any other suitable ion beam tool such as those included in commercially available focused ion beam (FIB) systems, helium ion microscopy (HIM) systems, and secondary ion mass spectroscopy (SIMS) systems.

As noted above, the inspection subsystem may be configured for directing energy (e.g., light, electrons) to and/or scanning energy over a physical version of the wafer thereby generating actual (i.e., not simulated) output and/or images for the physical version of the wafer. In this manner, the inspection subsystem may be configured as an "actual" tool, rather than a "virtual" tool, Computer subsystem(s) 102 shown in FIG. 1 may, however, include one or more "virtual" systems (not shown) that are configured for performing one or more functions using at least some of the actual optical output or images and/or the actual electron beam output or images generated for the wafer, which may include any of the one or more functions described further herein.

The one or more virtual systems are not capable of having the wafer disposed therein. In particular, the virtual system(s) are not part of inspection subsystem 10 or electron column 122 and do not have any capability for handling the physical version of the wafer. In other words, in a virtual system, the output of its one or more "detectors" may be output that was previously generated by one or more detectors of an actual inspection subsystem and that is stored in the virtual system, and during the "imaging and/or scanning," the virtual system may replay the stored output as though the wafer is being imaged and/or scanned. In this manner, imaging and/or scanning the wafer with a virtual system may appear to be the same as though a physical wafer is being imaged and/or scanned with an actual system, while, in reality, the "imaging and/or scanning" is involves simply replaying output for the wafer in the same manner as the wafer may be imaged and/or scanned.

Systems and methods configured as "virtual" inspection systems are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents. For example, the one or more computer subsystems described herein may be further configured as described in these patents.

The inspection subsystems described herein may be configured to generate output, e.g., images, of the wafer with multiple modes. In general, a "mode" is defined by the values of parameters of the inspection subsystem used for generating images of a wafer or the output used to generate images of the wafer. Therefore, modes that are different may be different in the values for at least one of the parameters of the inspection subsystem. In this manner, in some embodiments, the output includes images generated by the inspection subsystem with two or more different values of a parameter of the inspection subsystem. For example, in one embodiment of an optical inspection subsystem, at least one of the multiple modes uses at least one wavelength of light for illumination that is different from at least one wavelength of the light for illumination used for at least one other of the multiple modes. The modes may be different in the illumination wavelength as described further herein (e.g., by using different light sources, different spectral filters, etc.) for different modes. in another embodiment, at least one of the multiple modes uses an illumination channel of the inspection subsystem that is different from an illumination channel of the inspection subsystem used for at least one other of the multiple modes. For example, as noted above, the inspection subsystem may include more than one illumination channel. As such, different illumination channels may be used for different modes.

In a similar manner, the output generated by the electron beam inspection is subsystem may include output, e.g., images, generated by the electron beam inspection subsystem with two or more different values of a parameter of the electron beam inspection subsystem. The multiple modes of the electron beam inspection subsystem can be defined by the values of parameters of the electron beam inspection subsystem used for generating output and/or images for a wafer. Therefore, modes that are different may be different in the values for at least one of the electron beam parameters of the electron beam inspection subsystem. For example, in one embodiment of an electron beam inspection subsystem, at least one of the multiple modes uses at least one angle of incidence for illumination that is different, from at least one angle of incidence of the illumination used for at least one other of the multiple modes.

The computer subsystem(s) are configured for detecting defects on the wafer by applying a defect detection method to the output. Detecting defects on the wafer may be performed in any suitable manner known in the art (e.g., applying a defect detection threshold to the output and determining that any output having a value above the defect detection threshold corresponds to a defect or a potential defect) with any suitable defect detection method and/or algorithm.

The defects that are detected on the wafer will include different types of defects. The different types of defects will generally include at least some "nuisances" and at least some DOIs. "Nuisances" (which is sometimes used interchangeably with "nuisance defects") as that term is used herein is generally defined as defects that are detected on the wafer as such but are not really actual defects on the wafer. Instead, "nuisances" may be detected due to non-defect noise sources on the wafer (e.g., line edge roughness (LER), relatively small critical dimension (CD) variation in patterned features, thickness variations, etc.) and/or due to marginalities in the inspection subsystem itself or its configuration used for inspection.

Generally, therefore, the goal of inspection is not to detect nuisances on wafers. Despite substantial efforts to avoid such detection of nuisances, it is practically impossible to eliminate such detection completely. Therefore, it is important to identify which of the detected defects are nuisances and which are DOIs such that the information for the different types of defects can be used separately, e.g., the information for the DOIs may be used to diagnose and/or make changes to one or more fabrication processes performed on the wafer, while the information for the nuisances can be ignored, eliminated, or used to diagnose noise on the wafer and/or marginalities in the inspection process or tool.

The computer subsystem(s) are also configured for acquiring metrology data for the wafer. The metrology data is generated for the wafer by a metrology tool that performs measurements on the wafer at an array of measurement points on the wafer. Metrology and inspection are generally treated as separate domains in semiconductor manufacturing. For example, metrology is typically calibrated to a reference standard, and inspection is typically performed by comparing acquired signal results (output, signals, images, etc.) from proximate structures (e.g., within die, die-to-die, etc.) or versus a stored reference (recorded or generated through simulation or otherwise synthesized). For the metrology of in-process semiconductor wafers, variability in film thickness, wafer geometry profiles, and CD are some of the normal parameters collected either on metrology targets or directly on product circuit structures.

The metrology tool may have any suitable configuration known in the art. In one example, the optical and electron beam inspection subsystems described herein may be modified in one or more parameters such that they can be configured and used as metrology tools. In particular, the embodiments of the inspection subsystems described herein and shown in FIGS. 1 and 2 may be modified in one or more parameters to provide different imaging capability depending on the application for which they will be used. In one such example, the inspection subsystems shown in FIGS. 1 and 2 may be configured to have a higher resolution if they are to be used for metrology rather than for inspection. In other words, the embodiments of the inspection subsystems shown in FIGS. 1 and 2 describe some general and various configurations that can be tailored in a number of manners that will be obvious to one skilled in the art to produce subsystems having different capabilities that are more or less suitable for different applications such as inspection and/or metrology. In addition, if the same subsystem has variable hardware settings such that it can be used for both inspection and metrology, then the same subsystem can be used to generate both the inspection subsystem output and metrology data described herein.

The inspection subsystems described herein, however, will generally be configured to have lower resolution during inspection of a wafer than the resolution of a metrology tool during a metrology process. For example, even if the inspection subsystems described herein are configurable to have relatively high resolutions that would render them suitable for metrology, during an inspection process, the inspection subsystem would be configured for a lower high resolution to improve the throughput of the inspection process (especially since such a high resolution is not typically necessary or required for the inspection processes described herein). As described further herein, the nature of the embodiments described herein is to try to infer information from relatively low resolution inspection subsystem images or other data with models trained with classified higher resolution images or other data (e.g., metrology data). This same principle can be applied to both relatively low resolution optical inspection images or other output in addition to relatively low resolution electron beam inspection images or other output.

Figure 3:
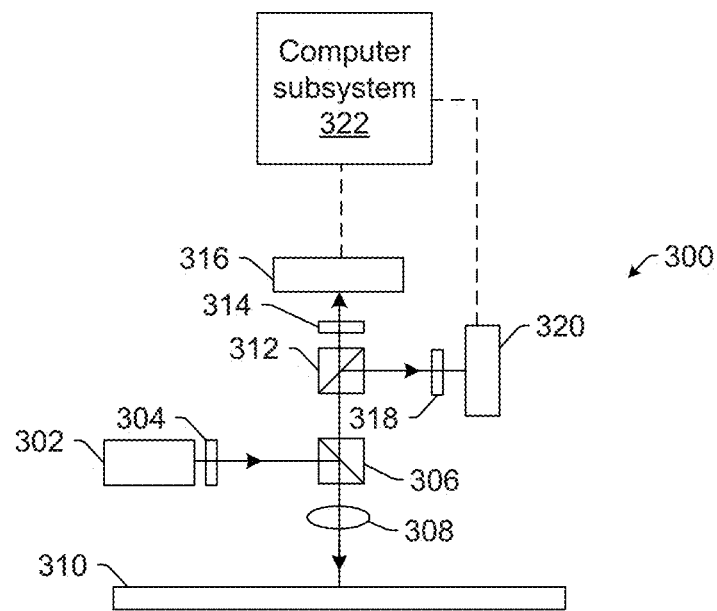
FIG. 3 is a schematic diagram illustrating a side view of an embodiment of a metrology tool configured as described herein.

FIG. 3, however, shows another embodiment of a metrology tool that may perform measurements on the wafer as described herein. In the case of an optical metrology tool, the metrology tool may include an illumination subsystem configured to direct light having one or more illumination wavelengths to a wafer. For example, in the metrology tool embodiment shown in FIG. 3, the illumination subsystem of metrology tool 300 includes light source 302, which may include any of the light sources described herein. Light generated by light source 302 may be directed through one or more spectral filters 304 of the illumination subsystem. Spectral filter(s) 304 may be configured as described further herein. The illumination subsystem may also include beamsplitter 306 that is configured to reflect light from the spectral filter(s) to objective 308 of the illumination subsystem. Beamsplitter 306 and objective 308 may be further configured as described herein. Objective 308 is configured to focus light having the one or more illumination wavelengths from the beamsplitter to wafer 310, which may include any of the wafers described herein.

In one embodiment, the illumination subsystem includes a broadband light source. For example, light source 302 shown in FIG. 3 may be a broadband light source, and one or more spectral filters 304 may be positioned in a path of light from the broadband light source. Therefore, the metrology tool may include a broadband source with a selectable wavelength range for illumination through wavelength dependent filters. For example, the wavelength(s) directed to the wafer may be altered by changing or removing the spectral filter(s) positioned in the path of the light from the light source. In this manner, the metrology tool may be configured to have flexible illumination wavelength(s) that can be varied depending on the materials on the wafer.

The metrology tool may also incorporate narrower or modified bandpass filters into the illumination subsystem. In one such embodiment, the one or more spectral filters include one or more interference filters. For example, spectral filter(s) 304 may be interference filter(s). In this manner, the metrology tool may include a broadband source with a selectable wavelength range for illumination through interference filters. These filters can complement or replace bandpass filters currently being used in tools.

In another embodiment, the illumination subsystem includes one or more narrowband light sources. In an additional embodiment, the illumination subsystem includes one or more laser light sources. The narrowband and/or laser light sources may include any suitable such light sources known in the art. For example, such light sources may include one or more diode lasers, diode-pumped solid state (DPSS) lasers, gas lasers, etc. In addition, the illumination subsystems described herein may include any number of broadband, narrowband, and laser light sources in any suitable combination. Furthermore, the light sources may be quasi-monochromatic light sources. Any of the light sources and illumination subsystem configurations described herein may be included in a metrology tool having any suitable configuration. In one particular example, the illumination subsystem may include only one laser source. In another example, an illumination subsystem may include multiple laser sources. Therefore, many different combinations of light sources and metrology tool configurations are possible and may be selected depending on, for example, the wafer and/or wafer characteristics that are to be measured by the tool.

The illumination subsystem may be configured in a number of different ways for selective illumination angle and/or polarization. For example, the illumination angle may be altered or selected by changing a position of a light source of the illumination subsystem or by controlling one or more other elements of the illumination subsystem that affect the illumination angle. The illumination angle that is altered or selected may be the polar angle and/or the azimuthal angle of the incident light. In addition, the illumination polarization may be selected by selecting a light source that emits light having the selected polarization or by including one or more polarization selection/alteration/filtering elements in the path of the light emitted by the light source.

The metrology tool also includes a detection subsystem configured to detect light from the wafer. As shown in FIG. 3, the detection subsystem includes objective 308 configured to collect light from wafer 310. In this embodiment, the collected light may include specularly reflected light. However, the collected light may alternatively or additionally include scattered light. The detection subsystem may also include beamsplitter 306 configured to transmit the light collected by the objective lens.

In some cases, the detection subsystem includes beamsplitter 312 configured to transmit light having one or more wavelengths of the light from the wafer, collected by the objective, and transmitted by beamsplitter 306. The detection subsystem may also include one or more bandpass filters 314 that may be configured as described further herein and may transmit light having one or more selected wavelengths. One or more of beamsplitter 306, beamsplitter 312, and bandpass filter(s) 314 may be configured to selectively transmit light having one or more selected wavelengths and to reflect or otherwise block light that does not have the one or more selected wavelengths out of the detection path of the detection subsystem such that they are not detected by detector 316.

In some instances, the detection subsystem includes one or more bandpass filters 318 and detector 320. In the configuration shown in FIG. 3, light reflected by beamsplitter 312 is directed to one or more bandpass filters 318, and light transmitted by the one or more bandpass filters is detected by detector 320. Bandpass filter(s) 318 and detector 320 may be further configured as described herein. Beamsplitter 312 may be configured to transmit light having one or more first wavelengths and to reflect light having one or more second wavelengths different than the first wavelength(s). In this manner, detectors 316 and 320 may detect light having different wavelengths.

In one embodiment, the illumination and detection subsystems include a common objective lens and a common dichroic mirror or beamsplitter, and the common objective lens and the common dichroic mirror or beamsplitter are configured to direct the light from a light source of the illumination subsystem to the wafer and to direct the light from the wafer to a detector of the detection subsystem. For example, as shown in FIG. 3, the illumination and detection subsystems may both include objective 308 making it a common objective lens and beamsplitter 306 making it a common dichroic mirror or beamsplitter. As described above, objective 308 and beamsplitter 306 are configured to direct the light from light source 302 of the illumination subsystem to wafer 310 and to direct the light from the wafer to detector 316 and/or detector 320 of the detection subsystem. In addition, any beamsplitters described herein can be replaced with dichroic mirrors that reflect certain wavelength bands of light and transmit the corresponding out of band light. Such configurations could increase the amount of light delivered to the wafer and increase the purity of the detected signal.

In one embodiment, one or more wavelengths of the light detected by the detection subsystem are selected by altering one or more parameters of the detection subsystem based on one or more materials on the wafer, one or more characteristics of the wafer that are being measured, or some combination thereof. Therefore, like the illumination wavelength range, the detection wavelength range can be adjusted depending on the wafer materials and the wafer characteristic(s) being measured. The wavelengths) detected by the detection subsystem may be altered as described herein (e.g., using bandpass filter(s)) or in any other suitable manner known in the art.

In one embodiment, the detection subsystem includes two or more channels configured to separately and simultaneously detect the light from the wafer in different wavelength ranges. For example, the metrology tool can be configured to include multiple parallel imaging channels that image varying wavelength ranges through suitable selection of dichroic and bandpass filter components. In the embodiment shown in FIG. 3, one of the channels may include bandpass filter(s) 314 and detector 316 and the other of the channels may include bandpass filter(s) 318 and detector 320. In addition, the metrology tool may include more than two channels (e.g., by insertion of one or more additional beamsplitters (not shown) into the path of the light from the wafer, each of which may be coupled to a detector (not shown) and possibly spectral filters (not shown) and/or other optical elements (not shown)). The channel including bandpass filters(s) 314 and detector 316 may be configured to detect light in a first wavelength band, and the channel that includes bandpass filter(s) 318 and detector 320 may be configured to detect light in a second wavelength band. In this manner, different wavelength ranges of light may be detected by different channels simultaneously. In addition, the different wavelength ranges may be mutually exclusive (e.g., separated by one or more wavelengths) or may overlap entirely (e.g., one wavelength range may be entirely within another wavelength range) or partially (e.g., multiple wavelength ranges may include the same one or more wavelengths, but at least some of the wavelengths in a first wavelength range are mutually exclusive of at least some of the wavelengths in a second wavelength range, and vice versa). In some embodiments, the detection subsystem includes a spectrometer configured to measure a characteristic of the light from the wafer across a wavelength range. For example, in the embodiment shown in FIG. 3, one or more of detectors 316 and 320 may be a spectrometer.

As described above, the detection subsystem may be configured to selectively and is separately detect the light from the wafer based on the wavelength of the light. In a similar manner, if the illumination subsystem is configured for selective illumination angle and/or polarization, the detection subsystem may be configured for selective detection of light based on angle from the wafer (or collection angle) and/or polarization. For example, the detection subsystem may include one or more apertures (not shown) that can be used to control the collection angles of the light detected by the detection subsystem. In another example, the detection subsystem may include one or more polarizing components (not shown) in the path of the light from the wafer that can be used to control the polarizations of the light detected by the detection subsystem.

The metrology tool also includes a computer subsystem configured to generate metrology data for the wafer using output generated by the detection subsystem responsive to the detected light. For example, in the embodiment shown in FIG. 3, the metrology tool may include computer subsystem 322, which may be coupled to detectors 316 and 320 by one or more transmission media shown in FIG. 3 by the dashed lines, which may include "wired" and/or "wireless" transmission media, such that the computer subsystem can receive output generated by the detectors of the detection subsystem that is responsive to the detected light. The output of the detectors may include, for example, signals, images, data, image data, and the like. For example, the detector(s) of the detection subsystem described above may be imaging detectors that are configured to capture image(s) of the wafer. The computer subsystem may be further configured as described herein. The metrology data may be any of the metrology data described herein. The metrology data may be stored in (or output as) a metrology results file.

It is noted that FIG. 3 is provided herein to generally illustrate some configurations of the metrology tool embodiments described herein. Obviously, the metrology tool configurations described herein may be altered to optimize the performance of the metrology tool as is normally performed when designing a commercial metrology tool. In addition, the metrology tools described herein may include an existing metrology tool (e.g., by adding functionality described herein to an existing metrology tool) such as Archer, ATL, SpectraShape, SpectraFilm, Aleris, WaferSight, ThermaProbe, RS-200, CIRCL, and Profiler tools that are commercially available from KLA-Tencor. For some such systems, the methods described herein may be provided as optional functionality of the existing metrology tool (e.g., in addition to other functionality of the existing tool). Alternatively, the metrology tool described herein may be designed "from scratch" to provide a completely new system.

Although the metrology tool shown in FIG. 3 is a light-based or optical tool, it is to be understood that the metrology tool may be configured to also or alternatively use a different type of energy to perform the measurements described herein. For example, the metrology tool may be an electron beam-based tool such as a scanning electron microscope (SEM) or a transmission electron microscope (TEM) and/or a charged particle beam-based tool such as a focused ion beam (FIB) tool. Such metrology tools may include any suitable commercially available metrology tool.

As described above, the metrology data is generated for the wafer by a metrology tool that performs measurements on the wafer at an array of measurement points on the wafer. The array of measurement points may be a regular array of measurement points, but that is not necessary for the embodiments described herein. In addition, the array of measurement points may be a two-dimensional array of measurement points on the wafer.

A density of the measurement points on the wafer, which may be determined as described further herein, may be used to determine the exact locations of the measurement points on the wafer. For example, based on the selected or predetermined density of the measurement points on the wafer, the measurement points can be evenly or regularly spaced across the area of the wafer that is be inspected such that the measurement points have the selected or desired density across the inspection area of the wafer.

Because the density and exact locations of the measurement points on the wafer are determined prior to detection of defects on the wafer and without respect to other features and patterned structures on the wafer, the exact locations of the measurement points on the wafer are less important than the density of the measurement points. The measurement points used to generate the metrology data described herein are therefore also different than those used for normal metrology measurements in that the normal metrology measurements are typically performed on certain patterned structures or films on the wafer, where the exact locations are necessarily important to ensure that the correct structure or material on the wafer is being measured. In contrast, the metrology data is used in the embodiments as described further herein to capture certain variations in the wafer characteristics, which affect the inspection results, rather than needing to measure a particular structure or film.

In one embodiment, the metrology tool generates the metrology data for the wafer prior to detecting the defects performed by the one or more computer subsystems. In another embodiment, the measurement points are determined prior to detecting the defects performed by the one or more computer subsystems and independently of the defects detected on the wafer. Generating the metrology data (and optionally acquiring it) before the defects are detected on the wafer can be advantageous for a number of reasons. For instance, as described further herein, if the metrology data is generated prior to defect detection, the metrology data can be used during inspection of the wafer, e.g., even as the wafer is being scanned by the inspection subsystem, which has particular advantages described further herein. Even if the metrology data is not used during the inspection (and is instead used after the defects have been detected on the wafer and/or scanning of the wafer is completed), the metrology data may still be generated prior to any scanning, defect detection, or inspection of the wafer layer on which the measurements were performed.

In any of the embodiments described herein, the one or more computer subsystems may query the metrology results at the beginning of inspection and prepare them for processing. (Querying the metrology results is likely to be done via database access and query, but can be performed in any other manner described herein.) This idea of querying metrology measurements at the beginning of inspection and pre-processing the measurements for inspection, i.e., linking metrology data through a database as a preprocessing step for inspections, is believed to be new. This is true for the metrology and inspection described herein since they are performed on the same layer of the wafer (i.e., both are performed on the wafer after one process has been performed on the wafer and before another process has been performed on the wafer). The timing of the metrology and inspection described herein does not necessarily apply to metrology and inspection performed on different layers of the wafer and/or after different processes have been performed on the wafer (e.g., where metrology is performed after a first process and inspection is performed after a second process different from the first process).

As also noted above, in one embodiment, the measurement points are determined independently of the defects detected on the wafer. Therefore, the measurements that are performed to generate the metrology data described herein are different than typical metrology measurements, which are generally performed after inspection of the wafer and may be performed on defects detected in the inspection (e.g., to generate more detailed information about the detected defects). In addition, if the metrology data is to be generated prior to inspection of the wafer as described herein, then the measurement points must be determined independently of the detected defects because the defects have not been detected on the wafer prior to the measurements and are therefore not available for use in determining where the measurement points are to be located.

Figure 5:
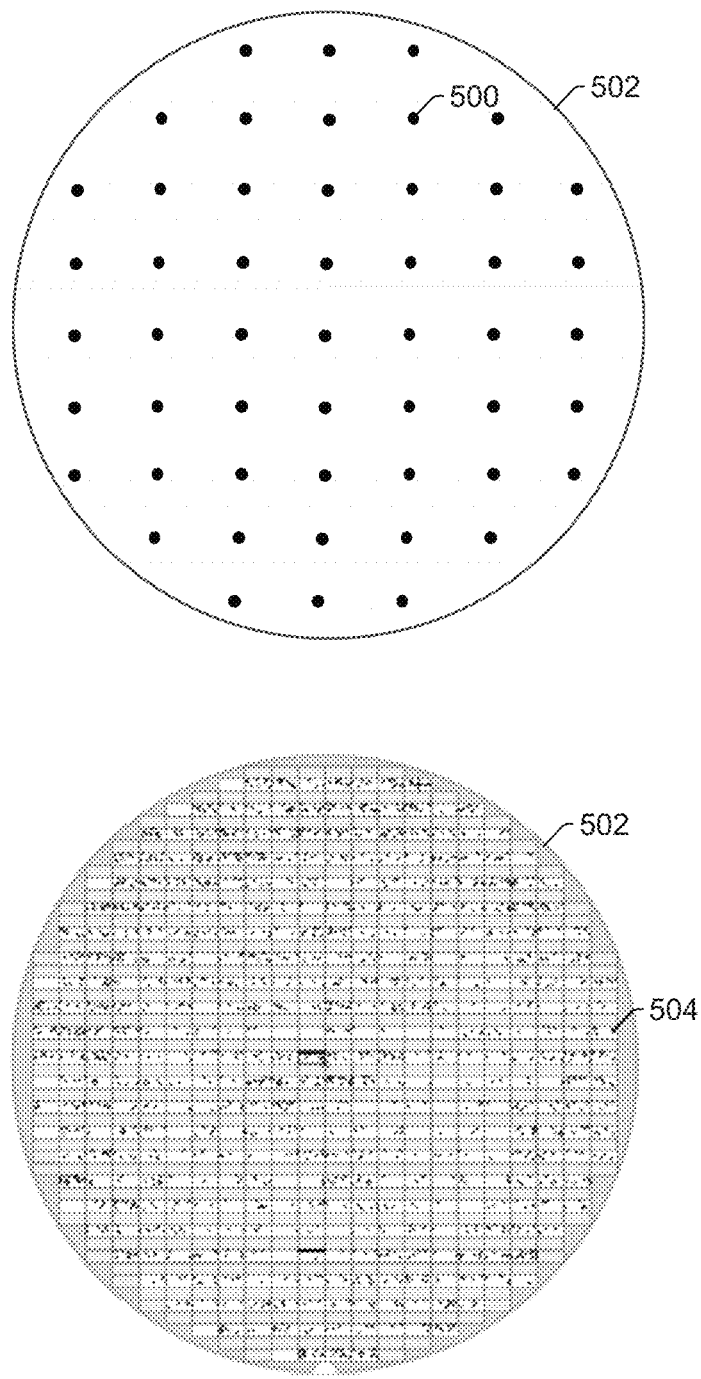
FIG. 5 is a schematic diagram illustrating a plan view of an embodiment of an array of measurement points on a wafer and an example of defects detected on the wafer.

As described further herein, the exact locations of the measurement points may be different than the exact locations of the defects detected on the wafer and may be determined based on the desired density of the measurement points on the wafer, which will in general be different than the density of the defects on the wafer. For example, as shown in FIG. 5, measurement points 500 may be arranged in an array on wafer 502, and the density of the points in the array may be determined as described further herein. As also shown in FIG. 5, the array of the measurement points is a two-dimensional array of the measurement points. The array of measurement points shown in FIG. 5 may be further configured as described herein. In contrast, as shown in FIG. 5, defects 504 may be detected on wafer 502 at a much higher density and frequency than the measurement points on the wafer. Furthermore, the measurement point locations may be determined independently of the defects detected on the wafer because the purpose of the measurements is not necessarily to measure one or more characteristics of defects on the wafer but to measure variations in one or more characteristics of the wafer, which may include one or more materials on the wafer and/or one or more patterned structures on the wafer (although not necessarily any particular materials and/or structures).

In some contexts, such variations in the one or more characteristics of the wafer may be considered defects. For example, one linkage between the metrology and inspection domains is that defects may occur during wafer processing if these variations reach sufficiently large deviations from specifications. In the embodiments described herein, the variations in characteristic(s) of the wafer are purposefully being measured regardless of whether the variations render the characteristic(s) defective. For example, even when these variations are insufficient to produce defects or be considered defective, they can affect the optical properties of wafers and can contribute to undesirable noise during light, electron beam, and other wafer inspections. In addition, if a defect happens to be present at one of the preselected measurement points, it may actually affect the metrology data generated at that measurement point. However, such measurements (of defects or characteristic(s) that render the wafer defective) are not the goal of the measurements described herein.

Instead, one advantage of the embodiments described herein is that the metrology data can be used to determine variations in the wafer characteristic(s) that affect the output generated for the wafer by detector(s) of the inspection subsystem, including such variations which may be below the resolution capability of the inspection subsystem but may still affect the inspection output and are not necessarily or inherently representative of any defects present on the wafer (e.g., the variations that are measured by the metrology tool may be within specification for the wafer characteristics and therefore not defective and yet still affect the output generated by the detector(s) of the inspection subsystem). In this manner, the embodiments described herein are configured for leveraging metrology measurements of the wafer characteristic(s) described herein in the inspection. As such, the embodiments described herein are configured to use metrology data in inspection. In contrast to the embodiments described herein, there is currently no practical method for using metrology data to improve the quality of optical or other inspection.

In one embodiment, at least some values of the metrology data generated by the metrology tool are below a resolution limit of the inspection subsystem. For instance, the metrology tool may be configured to have a higher resolution than the inspection subsystem, which may be true for all of the inspection subsystems described herein. In particular, the metrology tool may have a higher resolution than the optical subsystems described herein as well as the electron beam inspection subsystems described herein since in the context of the embodiments described herein, the electron beam inspection subsystems are configured to be relatively low resolution electron beam inspection subsystems. Therefore, such inspection subsystems will have a resolution that is lower than most metrology tools and in particular the metrology tools described herein that will be used to perform the measurements described herein. In this manner, the inspection subsystems described herein are configured such that the output generated by these inspection subsystems cannot be used to determine such variations. Nevertheless, the sub-resolution values of the wafer characteristics that are measured by the metrology tool can affect the output generated by the inspection subsystems described herein. The term "sub-resolution" as used herein refers to wafer characteristic values that are below the resolution capability of the inspection subsystem, which means that they cannot be resolved in or determined from the output or images generated by the inspection subsystem. Therefore, wafer characteristics that are sub-resolution are below the resolution of the inspection subsystem.

In the case of optical inspection, the effects of "within-spec" or sub-resolution dimension variations are reflected in optical properties, and they can contribute to color and other wafer noise sources detected in inspection. As such, they are implicitly captured by inspection (as nuisances) and mixed with other sources of noise (also detected as nuisances) and can only be separated from DOIs using optical properties obtained during inspection. The main disadvantage of relying solely on optical properties to separate non-critical variations in wafer dimensions erroneously detected as defects from DOIs is that all of these signals superimpose on top of each other and are difficult to separate. However, measuring the sub-resolution (with respect to the inspection subsystem) wafer characteristic variations can be used as described herein to eliminate the effect of these variations on the inspection subsystem output (by using the wafer characteristic variations to separate nuisances from DOIs) In this manner, providing the metrology measurements and anchoring the inspection subsystem output to these measurements provide better separation between DOIs and nuisances (according to studies on related phenomena performed by the inventors) and improve process monitoring (performed based on the DOIs separated from the nuisances).

A density of the measurement points on the wafer is less than a density of inspection points on the wafer at which the output is generated by the detector during inspection of the wafer. Metrology as that term is used herein is performed independently of inspection and typically with lower frequency. For example, in general, the measurement points will be spaced much farther apart from each other than the inspection points are spaced from each other. In particular, in most inspections that are performed on wafers, inspection points generally overlap with one another (as the light, electrons, etc. are scanned across the wafer) so that no portion of the area to be inspected on the wafer does not undergo inspection. Such overlap of the inspection points is therefore by design. Therefore, the density of the inspection points is so high that the inspection points overlap with each other at least a little bit. In contrast, it is desirable o select or determine the density of the measurement points to be as low as possible (for throughput and cost considerations) while still being sufficiently responsive to the variations of interest (described further herein) in the measurements. For example, the desired measurements (e.g., wafer topology, film thickness, CD, etc.) are performed in a grid of measurement points on the wafer that is dense enough to allow reliable prediction (e.g., interpolation, extrapolation, etc.) of the measurements to any point on the wafer.

As used herein, the term "point" as in "measurement point" or "inspection point" does not necessarily mean that the measurement or inspection is a "point" measurement or inspection. In other words, as used herein, the term "point" is meant to indicate a location or area at which a measurement is performed or inspection output is acquired. The measurement or inspection that is performed at any one "point" may however be performed across a relatively small area on the wafer (e.g., a spot or area on the wafer). In this manner, a "measurement point" as used herein is meant to indicate a location or area on a wafer at which a measurement is performed by a metrology tool, and each of the "measurement points" are discrete from one another on the wafer. In addition, an "inspection point" as used herein is meant to indicate an area on a wafer at which inspection output is generated by an inspection subsystem, but not each of the "inspection points" are necessarily discrete or spaced from each other because they will in general overlap with one another as inspection is normally performed.

Different minimum "densities" of measurement points may be used for different use cases. For example, film thickness variations tend to be relatively slow across the wafer so the density of film thickness measurements could be relatively low. On process window qualification (PWQ) wafers, certain CD measurements can be performed per modulation to get more reliable nuisance filtering that applies to all modulations. Therefore, a density of the measurement points that is "dense enough" for the embodiments described herein includes any density of measurement points that is large enough to make the prediction of the metrology data to the defect locations sufficiently accurate.

In one embodiment, the density of the measurement points is selected to capture wafer level variations in the metrology data. In another embodiment, the density of the measurement points is selected to capture die level variations in the metrology data. For example, the measurements are preferably performed at selected measurement points on the wafer with sufficient frequency to capture wafer-level and/or die-level variations. The frequency or density of the measurement points needed to capture wafer-level or die-level variations may be determined as described above, e.g., based on the expected variations in the metrology measurements that are performed and/or the expected wafer characteristics.

The metrology data can be determined or generated from the measurements performed at the measurement points in any suitable manner. In other words, many different methods, algorithms, models, functions, etc. are available in the art to determine the metrology data from the measurements. The metrology data used in the embodiments described herein may be generated in any of these known ways, In addition, metrology analysis (e.g., modeling of overlay and other metrology data) may be performed on the 5D Analyzer system, which is commercially available from KLA-Tencor. This system is established in the industry and contains capabilities for advanced metrology analysis. Metrology data can be delivered from this system or directly from the metrology tool if no further modeling is required.

In one embodiment, the metrology data includes one or more of film thickness, patterned structure profile, critical dimension (CD), line edge roughness (LER), and line width roughness (LWR). For example, the wafer characteristic(s) that may be particularly useful in embodiments described herein include targeted CD measurements such as line width, line roughness (CD uniformity) in particular structures, overlay measurements (applicable to optical inspection only), and any other such characteristic(s) that can affect the output generated for the wafer by the inspection subsystem and therefore the defect detection results produced by the computer subsystem(s). In other words, the metrology data described herein can include any and all measurements and/or wafer characteristic(s) that could correlate with inspection noise or lead to changes in optical properties of wafers during inspection. LER and LWR and methods for measuring and determining these characteristics are described in Chapter 2 of "Variation-Aware Advanced CMOS Devices and SRAM" by Shin, Springer Netherlands, 2016, pp. 19-35, which is incorporated by reference as if fully set forth herein. The measurement described herein may also be performed as described in commonly assigned U.S. Patent Application Publication No. 2016/0116420 by Duffy et al. published Apr. 28, 2018, which is incorporated by reference as if fully set forth herein. The embodiments described herein may be further configured as described in these references.

In one embodiment, the metrology tool is not included in the system. For example, the metrology tool may be included in one system that is different and separate from the system embodiments described herein. In other words, the metrology tool may be included in a system that is physically separate from the embodiments described herein and may not share any common elements with the system embodiments described herein. In particular, as shown in FIGS. 1 and 3, the inspection subsystem may be included in one system, the metrology tool may be configured as another system, and the system and metrology tool are completely physically separate from each other and share no common hardware elements.

In such embodiments, the one or more computer subsystems described herein may be configured to access and acquire the metrology data from a computer subsystem coupled to the metrology tool and/or a storage medium in which the metrology data has been stored by the metrology tool. The one or more computer subsystems may acquire the metrology data from another computer system or subsystem or a storage medium as described further herein. In this manner, the metrology tool and the system that includes the inspection subsystem may be different tools. The metrology data can be stored in a database (such as Klarity, commercially available from KLA-Tencor), from where the measurements can be retrieved during or after inspection.

In this manner, acquiring the metrology data does not necessarily include generating the metrology data. For example, as described above, the metrology tool may be configured to generate the metrology data and then a computer subsystem described herein may acquire the metrology data from the metrology tool, a computer subsystem of the metrology tool, or a storage medium in which the metrology data has been stored. As such, the metrology data that is acquired may have been generated by a system other than the embodiments described herein. However, in some embodiments, acquiring the metrology data may include generating the metrology data. For example, the embodiments described herein may include a metrology tool (as described further herein), and therefore the system embodiments described herein may be configured for generating the metrology data by performing the measurements on the wafer at the measurement points. Alternatively, the system embodiments (or one or more elements of the system) described herein may be configured to cause the metrology tool to perform the measurements on the wafer. Therefore, acquiring the metrology data may include performing the measurements on the wafer at the measurement points.

Figure 4:
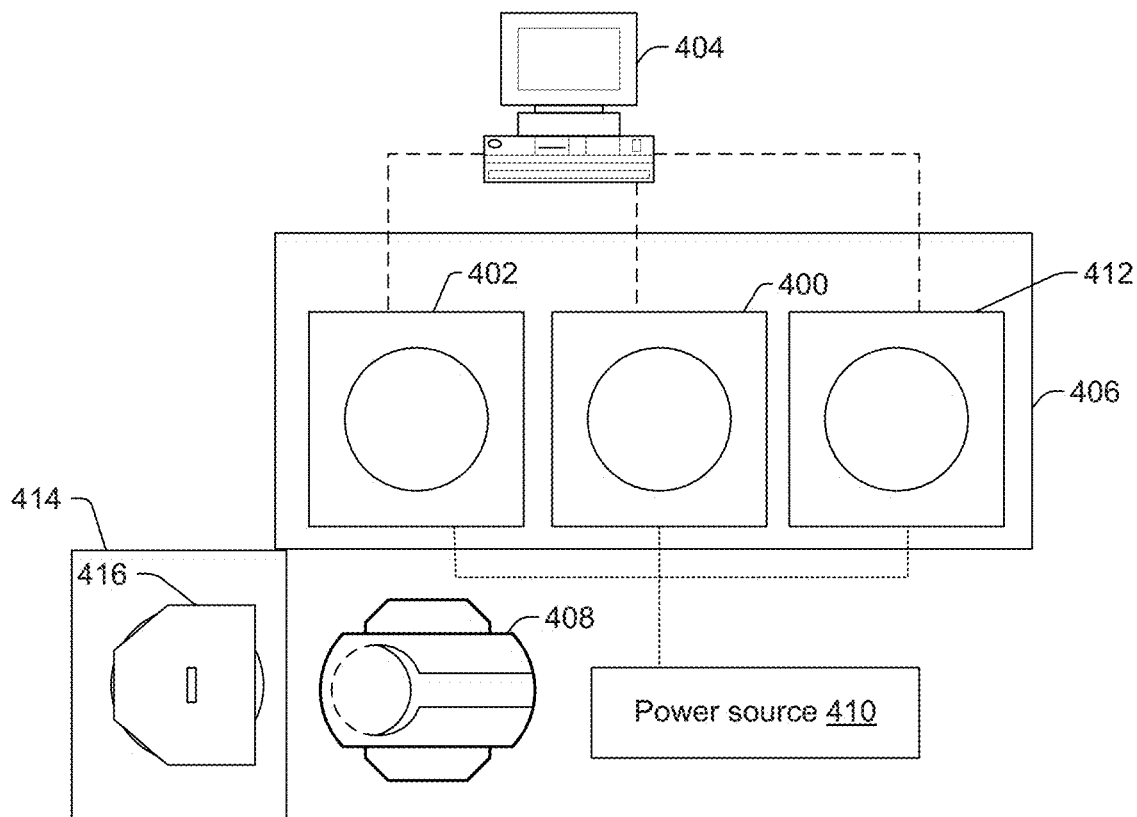
FIG. 4 is a schematic diagram illustrating a plan view of an embodiment of a system configured as described herein.

In one embodiment, the metrology tool is incorporated into the system such that the inspection subsystem and the metrology tool share one or more common elements of the system. FIG. 4 illustrates one embodiment of such a system. The system includes inspection subsystem module 400 and metrology tool module 402. The inspection subsystem included in module 400 may be configured as described herein with respect to FIGS. 1 and 2. The metrology tool included in module 402 may be configured as described herein with respect to FIG. 3. The system may also include computer subsystem 404 coupled to one or both of the inspection subsystem and the metrology tool. Computer subsystem 404 may be configured according to any other embodiments described herein.

In some embodiments, the system also includes additional module 412, and the additional module may be configured to perform one or more additional processes on the wafer. The one or more additional processes may include, for example, defect review, defect repair, and/or any other quality-control related processes.

The one or more common elements that may be shared by the metrology tool and the inspection subsystem may include one or more of common housing 406, common wafer handler 408, common power source 410, computer subsystem 404, or some combination thereof. The common housing may have any suitable configuration known in the art. For example, an original housing of the system may simply be expanded to accommodate the metrology tool. In this manner, the metrology tool and the inspection subsystem may be configured as a single unit or tool. The common wafer handler may include any suitable mechanical and/or robotic assembly known in the art. The common wafer handler may be configured to move the wafer between the metrology tool and the inspection subsystem in such a way that a wafer can be moved from the metrology tool directly into the inspection subsystem without having to put the wafer back into its cassette or other container between the processes. The common power source may include any suitable power source known in the art. The computer subsystem may be coupled to the metrology tool as described further herein as well as to the inspection subsystem such that the computer subsystem can interact with the metrology tool and the inspection subsystem as described further herein. The additional module may be incorporated into the system in the same manner described above.

The hardware of the metrology tool may be disposed in a measurement chamber, that is separate from the inspection subsystem and additional module included in the system. The measurement chamber may be disposed laterally or vertically proximate the inspection subsystem and the additional module. For example, the system may be configured as a cluster of modules that may each be configured to perform different processes. In addition, the measurement chamber, the inspection subsystem, and the additional module may disposed laterally or vertically proximate load chamber 414 of the system. The load chamber may be configured to support multiple wafers such as cassette 416 of wafers that are to be processed in the system. Wafer handler 408 may be configured to remove a wafer from the load chamber prior to measurement and/or inspection and to place a measured and/or inspected wafer into the load chamber. Furthermore, the measurement chamber may be disposed in other locations proximate the inspection subsystem such as anywhere where there is sufficient space for the metrology tool hardware and anywhere a wafer handler may fit such that a wafer may be moved between the measurement chamber and the inspection subsystem. In this manner, wafer handler 408, a stage (not shown), or another suitable mechanical device may be configured to move a wafer to and from the metrology tool and the inspection subsystem of the system.

The one or more computer subsystem(s) are also configured for determining locations of the defects on the wafer with respect to locations of the measurement points on the wafer. Determining the locations of the defects on the wafer with respect to the locations of the measurement points may include coordinate system matching between metrology and inspection recipes. In other words, for the correct overlay of defect and metrology data, the coordinate system and layout can be matched between the metrology tool and the inspection subsystem. The parameters that may be matched may include die size, die center location (0,0 die), reticle (exposure field) sizes, and die/reticle origin. In order to test a potential correct match of metrology and defect coordinate systems, a specific measurement point that has been measured by the metrology tool can be inspected on the inspection subsystem so that an x, y location reported by the inspection subsystem can be compared, correlated, and/or matched to the x, y location used in the metrology tool.

As described above, therefore, determining the locations of the defects with respect to the measurement point locations may include some kind of coordinate matching between the metrology tool and the inspection subsystem. In particular, the metrology tool and the inspection subsystem may report locations (measurement point locations and defect locations respectively) that are in different coordinate systems. Therefore, the coordinate systems can be matched to then determine the locations of the defects with respect to the locations of the measurement systems. That matching can be performed in a number of different ways. For example, one or more common reference points on a wafer that are measured or detected in both metrology and inspection can be identified and used to determine one or more offsets between the different coordinates used and/or reported in metrology and inspection. Those one or more offsets can then be used to translate any one reported location from one coordinate system to another. Once the defect locations have been translated to the metrology coordinates or the measurement point locations have been translated to the inspection coordinates, the locations of the defects with respect to the measurement point locations may be determined.

These relative locations may be determined in any suitable manner. For example, after coordinate system matching or translating, the defect locations that are the same as (or substantially the same as) the measurement point locations may be identified. These defect locations may include any defect locations that at least partially overlap with the locations of the measurement points and/or only the defect locations that are located entirely within a measurement point location. In addition, after coordinate system matching or translation, the defect locations that are not substantially the same as any of the measurement point locations may be identified (which may include most of the defect locations). In some instances, the defect locations with respect to the measurement point locations may be determined simply as the defect locations in the common coordinate system generated by coordinate system matching or translation. However, determining the defect locations with respect to the measurement point locations may also or alternatively include determining an offset or distance between each of the defect locations and the location(s) of the one or more closest measurement points in the common coordinate system generated by coordinate system matching or translation. Determining the locations of these defects with respect to the location(s) of the measurement points may therefore also include determining which of the measurement point(s) is/are closest to the defect locations, and that information may also be stored with the corresponding defect locations, In general, therefore, different methods can be used in the embodiments described herein to determine the relative locations between the defect locations and the measurement point locations in a common coordinate system.

The one or more computer subsystem(s) are further configured for assigning metrology data to the defects as a defect attribute based on the locations of the defects determined with respect to the locations of the measurement points. For example, the one or more computer subsystems may attach the predicted, e.g., interpolated, measurements to the inspection results in the form of defect-level attributes. The metrology based defect-level attributes may be included in the inspection results file as any other defect attribute. In one such example, in a table of inspection results, each row may include different information generated for a defect, and each column may correspond to one type of the different information (e.g., defect ID, defect x coordinate, defect y coordinate, a first defect attribute, a second defect attribute, and so on). Therefore, the metrology-based defect-level attributes may be attached to the inspection results by adding a column for each of the metrology-based defect-level attributes, and each row in the column(s) includes the metrology-based defect-level attribute(s) for the defect corresponding to each row.

In this step, each defect may be assigned a defect attribute that is the value of the metrology data determined at the location at which each defect was detected. In one such example, each defect may be assigned a metrology based defect attribute that is the film thickness value determined at the location at which each defect was detected. In addition, assigning the metrology data to the defects may include assigning more than one type of metrology data to the defects as more than one metrology based defect attribute based on the locations of the defects determined with respect to the locations of the measurement points. For example, each defect may be assigned two metrology based defect attributes that are the values of a film thickness and a CD determined at the locations at which each defect was detected. In this manner, the assigning step may include assigning metrology data to the defects as one or more defect attributes based on the locations of the defects determined with respect to the locations of the measurement points. The embodiments described herein therefore are configured for wafer inspection with metrology data integrated as defect level attributes.

The metrology data that is generated at the measurement points may or may not be different from the metrology data that is assigned to the defects. For example, generating the metrology data may include performing more than one type of measurements at the measurements points and/or determining two or more different characteristics of the wafer at the measurement points from one or more types of measurements. In this manner, the metrology data generated at each measurement point may include information for the wafer location of the measurement point and its corresponding measurements, e.g., M=(X, Y, A, B, . . . , D), where X and Y are the X and Y coordinates of the measurement points, and A, B, . . . , D are the values of the measurements performed at the measurement points and/or the values of the metrology data determined from the measurements performed at the measurement points. In such instances, not all of the metrology data may be assigned to the defects as a defect attribute or attributes. For example, the metrology data may include patterned structure profile and line width roughness and either one or both of those characteristics may be assigned to the defects as defect attribute(s). For example, the metrology data that is assigned to the defects may be determined by predicting (e.g., interpolating or extrapolating) metrology data to defect locations, and each defect may be auto-labeled. with the measurement(s) or metrology data as new defect-level attribute(s), e.g., M=(X, Y, A, B, . . . , D), where X and Y are the X and Y coordinates of the defects, and A, B, . . . , D are the values of the measurements or metrology data predicted at the defect locations. In some instances, which of the measurement types are performed and/or which of the characteristic(s) are determined and then assigned to the defects may be user-selectable. For example, the metrology data that is assigned to the defects as one or more defect attributes may be selectable by a user to allow injection of domain knowledge into the steps performed using the defect attribute(s), e.g., classification and/or nuisance filtering.

The assigning includes, for the defects detected at the measurement points, assigning the acquired metrology data generated at the measurement points to the defects based on which of the measurement points at which the defects were detected. For example, as described further above, determining the defect locations with respect to the measurement point locations may include determining if any of the defect locations overlap or are the same as the measurement point locations in the same coordinate system. If any of the measurement point locations overlaps or is the same as a defect location, then the metrology tool has effectively performed a measurement at the defect location even though that was not by design. In any case, since a measurement has effectively been performed for defects having locations that are the same as or overlap with a measurement point location, the metrology data generated at the measurement point locations may be assigned to those defects. In this manner, if a defect is detected at a first of the measurement points, the defect may be assigned the metrology data generated at the first of the measurement points; if a defect is detected at a second of the measurement points, the defect may be assigned the metrology data generated at the second of the measurement points; and so on.

However, as described further herein, since the measurement points are selected without knowledge of the defects detected on the water and at a significantly lower density than the density of the defects detected on the wafer, another method may be used for assigning the metrology data to many (or most) of the detected defects. In particular, the assigning includes, for the defects not detected at any of the measurement points, predicting the metrology data at locations at which the defects were detected from the metrology data generated at the measurement points and the locations of the defects determined with respect to the locations of the measurement points. For example, the metrology data generated at the measurement points may be used during inspection to predict the metrology data at the locations of the defects using one of the methods described herein. Since a significant portion of the defects will typically not be detected at the same locations as the measurement points on the wafer, the predicting will be an important step in making the embodiments described herein work properly.

In one embodiment, the predicting includes interpolation of the acquired metrology data from the measurement points to the locations of the defects determined with respect to the locations of the measurement points. Interpolation can be generally defined in the art as the prediction of values within a given data range. The interpolation used in the predicting step may include any suitable interpolation method known in the art. Examples of suitable interpolation methods include, but are not limited to, linear interpolation, polynomial interpolation, spline interpolation, non-linear interpolation, interpolation via a Gaussian process, multivariate interpolation, bilinear interpolation, and bicubic interpolation, all of which may be performed in any suitable manner known in the art.

In another embodiment, the predicting includes extrapolation of the acquired metrology data from the measurement points to the locations of the defects determined with respect to the locations of the measurement points. Extrapolation can be generally defined in the art as the prediction of data outside of a given data range. For a metrology to defect correlation, precise metrology data for all defects detected on a wafer is preferable. Since the metrology measurements will rarely be at the same locations at which the defects were detected, the metrology data can be extrapolated to the defect locations. The accuracy of the extrapolation depends on the density of the metrology measurements on the wafer and the model that is used for the extrapolation. The model that is used for extrapolation depends on the metrology use case (CD, film, overlay, etc.). There are different methods that can be used for extrapolation.

One such extrapolation method is contour plot based extrapolation. For example, once the metrology data has been acquired, a contour plot for the data can be generated in any suitable manner known in the art. Once a contour plot is available, a value of a wafer characteristic in the metrology data can be extracted for each point on the wafer in a user-defined grid size. This metrology value can then be applied to defects within that same grid. In this manner, metrology values can be assigned to each defect according to the value of the grid in which the defect is located.

Another such extrapolation method is modeled based extrapolation, which may be particularly useful for overlay metrology data. Based on the initial overlay measurements, a model can be generated in the Analyzer. The correct use of the model can be determined based on the sampling plan of the measurements and a model for the exposure tool used to fabricate the layer of the wafer being inspected. Based on an available model, the data can be exported for a user-defined number of measurement points across the wafer. The 5D Analyzer can populate any defined point on the wafer with the modeled data from the actual measurements to get a relatively large number of modeled overlay data across the wafer. This data can then be attached to the inspection results like any other metrology data for the X and Y directions. Once the data is combined with the defect detection data, the contour plot methodology described above can be applied for every defect detected on the wafer using a defined grid.

For the modeled based methodology, the calculated model terms can be exported to the one or more computer subsystems. If the values for each model term and each wafer measured as well as the model are exported to the one or more computer subsystems, the computer subsystem(s) can then calculate the overlay value for every defect location on the wafer. This method would reduce the required data transfer between the metrology tool (or the 5D analyzer) and the one or more computer subsystems and would allow the determination of the precise modeled overlay results for each defect location rather than an approximation with a grid as described above. Although the modeled based approach has been described above as being used for overlay data, this approach can be used for any other metrology data described herein because the 5D Analyzer has the capability to model any metrology data.

The one or more computer subsystems are also configured for determining if the defects are nuisances or DOIs based on the defect attributes assigned to the defects. The one or more computer subsystems may be configured to use the newly created attributes (i.e., the metrology-based defect-level attributes) as any other defect attributes in a defect classifier or nuisance filter such as one of those described further herein to get improved DOI/nuisance separation. In this manner, the embodiments described herein integrate metrology into inspection and in particular nuisance filtering of metrology-labeled inspection results. In other words, the metrology data that is assigned to the defects as a defect attribute is integrated into the inspection process of determining Which detected defects are nuisances and which detected defects are DOIs. One significant advantage of the embodiments described herein, therefore, is that they introduce explicitly into inspections known measurements of various relevant wafer characteristics that affect output generated for the wafer during inspection and thus negatively impact the ability to separate nuisances from DOIs. This concept of taking metrology data, predicting (e.g., interpolating, extrapolating, etc.) it at detected defect locations and using it as defect-level attribute(s) for nuisance filtering and defect classification is believed to be new. In addition, the additional information from metrology tools used as described herein will allow more robust diagnostics of inspection results and will significantly improve the ability to separate unimportant factors.

In one embodiment, the metrology data is responsive to characteristics of the wafer that contribute to noise in the output generated by the detector for the wafer, and determining if the defects are the nuisances or the DOIs based on the defect attributes reduces instability of the inspection due to the noise. In particular, the embodiments described herein can improve inspection stability since the measurements capture water characteristics that contribute to the inspection noise. In one such embodiment, the noise includes wafer level noise. In another such embodiment, the noise includes wafer-to-wafer noise. For example, by using the metrology data described herein as defect-level attributes, undesirable wafer-level and wafer-to-wafer variations that produce variable DOI capture rates and nuisance rates in defect (process) monitoring are suppressed. The idea of using metrology data as defect-level attributes to learn wafer noise better and to stabilize the inspection with respect to wafer-to-wafer variations is believed to be new.

In one embodiment, the defect detection method includes subtracting the output for reference locations on the wafer from the output for target locations on the wafer corresponding to the reference locations. For example, optical inspections on patterned wafers (such as those performed using a BM) light source or with laser scattering) generally operate on the principle of subtracting reference output (e.g., reference images) from target output (e.g., target images). Such defect detection may be performed for die-to-die inspection in logic areas of a die and cell-to-cell inspection in array areas of a die. The wafer noise characteristics in those inspections will then be directly related to the physical differences on the wafer in the target and reference locations. Therefore, in some cases, the direct correlation between inspection noise and metrology (e.g., CD measurements, film thickness, and others described herein) cannot be obtained simply by interpolating or extrapolating the metrology measurements to the defect locations and creating defect attributes from the interpolated or extrapolated values.

In one such embodiment, the one or more computer subsystems are configured for determining locations of the reference locations with respect to the locations of the measurement points on the wafer. The reference locations relative to the measurement point locations may be determined as described further herein (with respect to determining the locations of the defects on the wafer with respect to the locations of the measurement points on the wafer).

In such an embodiment, assigning the metrology data to the defects as the defect attribute includes assigning the metrology data to the reference locations as a reference attribute based on the locations of the reference locations determined with respect to the locations of the measurement points. Assigning the metrology data to the reference locations includes, for reference locations located at the measurement points, assigning the acquired metrology data generated at the measurement points to the reference locations based on which of the measurement points at which the reference locations are located. This step may be performed as described further herein with respect to the defect locations relative to measurement point locations. Assigning the metrology data to the reference locations also includes, for the reference locations not located at any of the measurement points, predicting the metrology data at the reference locations from the metrology data generated at the measurement points and the locations of the reference locations determined with respect to the locations of the measurement points. This step may also be performed as described further herein with respect to the defect locations.

In such an embodiment, assigning the metrology data to the defects as the defect attribute includes determining the defect attribute for one of the defects detected at one of the target locations by subtracting the reference attribute assigned to one of the reference locations, the output for which was subtracted from the one of the target locations in the defect detection method, from the metrology data assigned to the one of the defects. This step may be repeated for any other defects using the metrology data assigned to their corresponding defect and reference locations. In this manner, the one or more computer subsystems may assign metrology data to the locations of the defects and the reference locations (e.g., by interpolation, extrapolation, etc.), subtract the values for the metrology data for corresponding defect and reference locations, and form defect attributes from the subtracted values. As such, the metrology data assigned to the defect and reference locations may be subtracted in the same manner as for defect detection to generate a defect attribute for the defects that is responsive to the target to reference variations in the wafer characteristic(s).

The embodiments described herein can therefore improve inspection stability to physical differences between the target and reference locations on the wafer that contribute to inspection noise. For example, wafer noise characteristics due to the physical differences between the target and reference locations on the wafer can cause noise and nuisances to be detected on the wafer. However, the defect attributes determined as described herein can be responsive to such wafer noise characteristics and using such defect attributes to separate nuisances and DOIs as described further herein will diminish the effects of such noise (e.g., die-to-die noise, cell-to-cell noise, etc.) on inspection results.

In some embodiments, the one or more computer subsystems are configured for generating additional data from the acquired metrology data as a function of the measurement points on the wafer and assigning the additional data to the defects as another defect attribute based on the locations of the defects determined with respect to the locations of the measurement points. In one such embodiment, assigning the additional data includes, for the defects detected at the measurement points, assigning the additional data at the measurement points to the defects based on which of the measurement points at which the defects were detected, and, for the defects not detected at any of the measurement points, predicting the additional data at the locations at which the defects were detected from the additional data at the measurement points and the locations of the defects determined with respect to the locations of the measurement points. For example, the one or more computer subsystems may optionally generate other quantities from the measurements such as measurement gradients, etc. and attach them to the inspection in the same way described further herein. The other quantities such as measurement gradients and the like may be determined in any suitable manner known in the art.

In some such embodiments, determining if the defects are the nuisances or the DOIs is performed based on the defect attributes and the other defect attributes assigned to the defects. Therefore, these other defect attributes may be used in combination with the metrology-based defect level attributes that are determined as described herein. In other words, the metrology data that is assigned to the defects as described herein may be used in combination with any other defect attributes that are determined for the defects based on the metrology data to thereby increase the ability of the computer subsystem(s) to separate nuisances from DOI(s). As described further herein, determining if the defects are the nuisances or the DOI(s) may be performed with a learning based defect classifier. Therefore, the metrology data assigned to the defects in combination with any other data determined for the defects from the metrology data may be input to the learning based defect classifier such that the learning based classifier can select which of the metrology data and data determined therefrom are useful as defect attribute(s) for separating the defects into nuisances and DOIs.

In another embodiment, determining if the defects are the nuisances or the DOIs is performed based on the defect attributes assigned to the defects and one or more other defect attributes determined for the defects by the one or more computer subsystems based on the output generated by the detector. For example, the one or more computer subsystems may be configured to determine one or more defect attributes for the detected defects using the output generated by the inspection subsystem and/or any other information for the wafer that is available to the computer subsystem(s) (e.g., any design information for the wafer). Therefore, these other defect attributes may be used in combination with the metrology-based defect level attributes that are determined as described herein. In other words, the metrology data that is assigned to the defects as described herein may be used in combination with any other defect attributes that are determined for the defects by inspection to thereby increase the ability of the computer subsystem(s) to separate nuisances from DOI(s). As described further herein, determining if the defects are the nuisances or the DOI(s) may be performed with a learning based defect classifier. Therefore, the metrology data assigned to the defects in combination with any other defect attributes determined for the defects may be input to the learning based defect classifier such that the learning based classifier can select which of the metrology data and defect attributes are useful for separating the defects into nuisances and DOIs.

In some embodiments, determining the locations of the defects, assigning the metrology data, and determining if the defects are the nuisances or the DOIs are performed while the inspection subsystem directs the energy to the wafer and the detector generates the output responsive to the detected energy. For example, one way to implement the capability described herein is to store the location-specific metrology data in a database and retrieve it during the inspection, calculate the defect-level attributes on the fly, and apply the nuisance filter inline so that the impact of huge pre-filter defectivity on inspection throughput is minimized. Although the calculation of additional defect attributes could introduce throughput overhead, the calculations will be substantially simple and should be extremely fast in comparison with the existing processing done on detected defects.

In another embodiment, assigning the metrology data and determining if the defects are the nuisances or the DOIs are performed after all of the defects are detected on the wafer. For example, another way to implement the embodiments described herein is to post-process the inspection results with the metrology data. This approach, however, would not be able to remove defects in-line with potential impact on the inspection throughput.

As described above, therefore, the nuisance filter can run at multiple points in the inspection signal processing flow. In addition to the embodiments described above, the initial detection can run very "hot" producing orders of magnitude more candidates than you would consider reporting from the inspector. An "on leaf" (i.e., the same computer node that does the detection) version of the nuisance filter can run serving essentially as an extension of the "detection" process. This nuisance filter can be configured to use the metrology based defect attributes of this inspection. Another round of nuisance filtering can be performed once the wafer is inspected and wafer level attributes are calculated (signatures, design based binning, etc.).

In a further embodiment, the one or more computer subsystems are configured for separating the nuisances from the DOIs in inspection results generated for the wafer by the one or more computer subsystems. For example, the defects that are identified as nuisances can be eliminated from the inspection results completely such that the inspection results only include information for the defects identified as DOIs. However, in some instances, it may be useful to not eliminate the information for the defects identified as nuisances completely. In such instances, the inspection results may include separate files, databases, or other data structures for the defects identified as the nuisances and the defects identified as the DOIs. In this manner, information for the nuisances will be separate from the information for the DOIs which can make using the different information easier. However, in other instances, separating the nuisances from the DOIs in the inspection results does not necessarily include eliminating or separating the information. For example, separating the nuisances from the DOIs can include simply labeling each of the defects as a nuisance or a DOI (e.g., via a classification code) and storing those labels in the inspection results with any other information for the defects generated by inspection and/or the computer subsystem(s) described herein. In this manner, if information for either the nuisances or the DOIs is to be used, the entire inspection results file can simply be filtered or sorted by the labels that have been assigned to the defects. In any of these methods for separating the defects, the information for the nuisances and the DOIs can be easily accessed and used either separately or collectively.

All of the methods described herein may include storing results of one or more steps of the method embodiments in a computer-readable storage medium. The results may include any of the results described herein and may be stored in any mariner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. to perform one or more functions for the wafer or another wafer of the same type. Such functions include, but are not limited to, altering a process such as a fabrication process or step that was performed on the wafer in a feedback manner, altering a process such as a fabrication process or step that will be performed on the wafer in a feedforward manner, etc.

The results of any of the steps described herein can be stored and used for one or more other applications. For example, the linkage between metrology measurements and noise characteristics on the wafer can be exploited for process monitoring and classifier (nuisance filter) maintenance. In one such example, the additional information from a metrology tool used as described herein will allow more robust diagnostics of inspection results and significantly improves the ability to separate unimportant factors, Monitoring the inspection process may include using the metrology data in combination with the defect detection results to determine how the characteristic(s) of the wafer affected the defect detection results. Therefore, the defect detection results and the combined metrology data can be used to determine if the inspection process performed by the inspection subsystem needs to be adjusted in response to change(s) in the wafer. In a similar manner, the metrology data and the results of determining which of the defects are nuisances and which of the defects are DOIs can be used to adjust one or more parameters of the defect classifier, e.g., via re-tuning or re-training, which may be performed as described further herein.

Metrology to defect correlations can also be an important tool as design rules and/or process windows are shrinking and killer systematic process and patterning defects are increasing. As technologies approach sub 14 nm design nodes, overlay in addition to focus and exposure has become an important lithography parameter acting as a source of new systematic defects on an otherwise centered process. Besides overlay and CD film thickness, wafer topography and other metrology data can be the root cause of these defects. It is becoming important to not only detect the root cause of these defects (systematic defect discovery) but also find ways to expand the process window (process window expansion).

In one embodiment, determining if the defects are the nuisances or the DOIs includes inputting the defect attributes to a learning based defect classifier. For example, the component(s), component(s) 100 shown in FIG. 1, executed by the computer subsystem(s), e.g., computer subsystem 36 and/or computer subsystem(s) 102, include learning based defect classifier 104. The learning based defect classifier is configured for classifying the defects detected on the wafer. Although the learning based defect classifier is generally referred to herein as a "defect classifier," the learning based defect classifier can also be referred to as a nuisance filter since the main purpose for which it will be configured is for separating nuisances from DOIs. Since separating nuisances from DOIs can. in of itself, be considered a kind of defect classifying, the learning based defect classifier that is configured for such separating is generally referred to herein as a defect classifier.

The learning based defect classifier may only separate nuisances from DOIs, meaning that it assigns an identifier that is either a nuisance or a DOI. However, the learning based defect classifier may also be configured for separating nuisances from DOIs as well as different DOIs from each other. Therefore, the learning based defect classifier may assign a classification to each of the defects that may be a nuisance classification, a first DOI classification, a second DOI classification, etc. In this manner, the defect classifiers described herein can be configured for multi-class classification problems as well as the nominal "real" versus "nuisance" filtering applications.

Adding a metrology "channel" to nuisance filtering machine learning algorithms can work for a number of approaches. One example of such an approach is a random forest decision tree-based machine learning approach to nuisance event filter (NEF) creation. As with other machine learning models, the training step is performed with positive and negative examples (or "counter examples") that have been verified with SEM or other ground truth methods or systems to be "ground truth" examples for training. Positive examples would be "real defects," and negative examples would be nuisance events. In addition to random forest decision trees, additional examples of machine learning methods and algorithms that can be used for the defect classifier are described further herein. Basically, although some particularly useful defect classifier embodiments are described in detail herein, any defect classifier that can take the inspection subsystem output (e.g., images) for the defects plus other potential "channels" of data (e.g., the metrology data described herein), such that a mix of input images (or other inspection subsystem output) and attributes can be accommodated by appropriately defined defect classification methods, can be used to separate the nuisances from the DOIs in the identifying step described herein.

Figure 6:
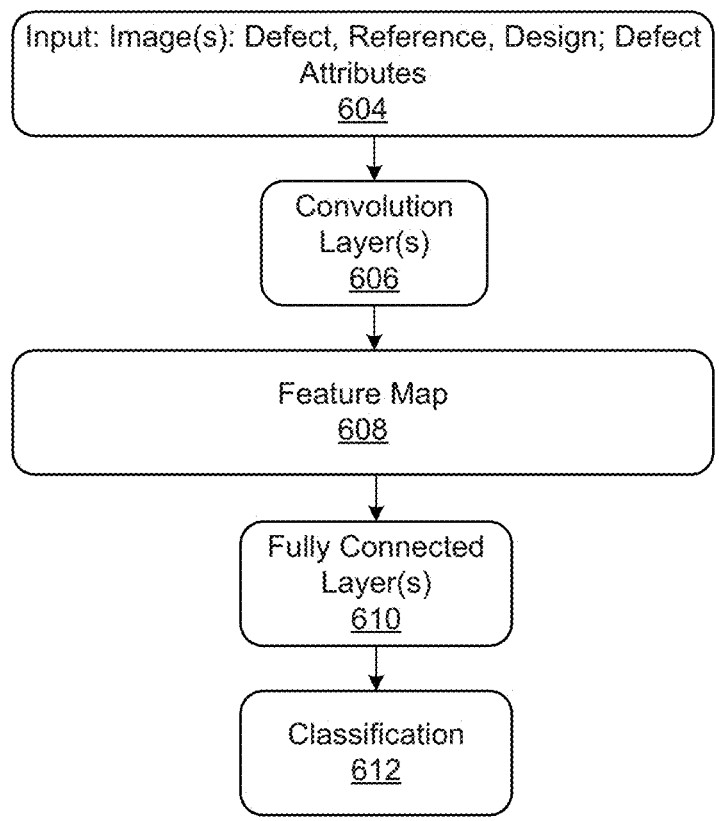
FIG. 6 is a flow diagram illustrating one embodiment of a learning based defect classifier configured as described herein.

FIG. 6 shows one embodiment of a learning based model that may be used as the learning based defect classifier in the embodiments described herein. The learning based model may include a first portion configured for determining features of input for the wafer generated by an inspection subsystem or a computer subsystem coupled to the inspection subsystem. For example, as shown in FIG. 6, a first portion of the learning based model includes, in one embodiment, convolutional layer(s) 606 that determine features (e.g., feature map 608) of input 604, which includes image(s), which may include at least defect images and possibly also reference images and design, and defect attributes determined as described herein. These layers may be further configured as described herein. The images, the defect attributes, and the features may also be further configured as described herein.

The learning based model also includes a second portion configured for classifying the defects detected on the wafer based on the determined features. For example, as shown in FIG. 6, a second portion of the learning based model includes, in one embodiment, fully connected layer(s) 610. As further shown in FIG. 6, the input to fully connected layer(s) 610 is the determined features, e.g., feature map 608, and the output of fully connected layer(s) 610 is classification 612. Therefore, fully connected tip layer(s) 610 may be included in the second portion and may be configured for defect classification. These layers may be further configured as described herein. The various one or more outputs may also he further configured as described herein.

In one embodiment, the learning based defect classifier is configured as a deep learning model. Generally speaking, "deep learning" (also known as deep structured learning, hierarchical learning or deep machine learning) is a branch of machine learning based on a set of algorithms that attempt to model high level abstractions in data. In a simple case, there may be two sets of neurons: ones that receive an input signal and ones that send an output signal. When the input layer receives an input, it passes on a modified version of the input to the next layer. In a deep learning based model, there are many layers between the input and output (and the layers are not made of neurons but it can help to think of it that way), allowing the algorithm to use multiple processing layers, composed of multiple linear and non-linear transformations.

Deep learning is part of a broader family of machine learning methods based on learning representations of data. An observation (e.g., an image) can be represented in many ways such as a vector of intensity values per pixel, or in a more abstract way as a set of edges, regions of particular shape, etc. Some representations are better than others at simplifying the learning task (e.g., face recognition or facial expression recognition). One of the promises of deep learning is replacing handcrafted features with efficient algorithms for unsupervised or semi-supervised feature learning and hierarchical feature extraction.

Research in this area attempts to make better representations and create models to learn these representations from large-scale unlabeled data. Some of the representations are inspired by advances in neuroscience and are loosely based on interpretation of information processing and communication patterns in a nervous system, such as neural coding which attempts to define a relationship between various stimuli and associated neuronal responses in the brain.

In another embodiment, the learning based defect classifier is a machine learning model. Machine learning can be generally defined as a type of artificial intelligence (AI) that provides computers with the ability to learn without being explicitly programmed. Machine learning focuses on the development of computer programs that can teach themselves to grow and change when exposed to new data. In other words, machine learning can be defined as the subfield of computer science that "gives computers the ability to learn without being explicitly programmed." Machine learning explores the study and construction of algorithms that can learn from and make predictions on data—such algorithms overcome following strictly static program instructions by making data driven predictions or decisions, through building a model from sample inputs.

The machine learning described herein may be further performed as described in "Introduction to Statistical Machine Learning," by Sugiyama, Morgan Kaufmann, 2016, 534 pages; "Discriminative, Generative, and Imitative Learning," Jebara, MIT Thesis, 2002, 212 pages; and "Principles of Data Mining (Adaptive Computation and. Machine Learning)," Hand et al., MIT Press, 2001, 578 pages; which are incorporated by reference as if fully set forth herein. The embodiments described herein may be further configured as described in these references.

In some embodiments, the learning based defect classifier is a generative model. A "generative" model can be generally defined as a model that is probabilistic in nature. In other words, a "generative" model is not one that performs forward simulation or rule-based approaches. Instead, the generative model can be learned (in that its parameters can be learned) based on a suitable training set of data. In one embodiment, the learning based defect classifier is configured as a deep generative model. For example, the learning based defect classifier may be configured to have a deep learning architecture in that the defect classifier may include multiple layers, which perform a number of algorithms or transformations.

In a further embodiment, the learning based defect classifier may be a deep neural network with a set of weights that model the world according to the data that it has been fed to train it. Neural networks can be generally defined as a computational approach which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and excel in areas where the solution or feature detection is difficult to express in a traditional computer program.

Neural networks typically consist of multiple layers, and the signal path traverses from front to back. The goal of the neural network is to solve problems in the same way that the human brain would, although several neural networks are much more abstract. Modern neural network projects typically work with a few thousand to a few million neural units and millions of connections. The neural network may have any suitable architecture and/or configuration known in the art.

In one embodiment, the learning based defect classifier is configured as an AlexNet. In general, an AlexNet includes a number of convolutional layers (e.g., 5) followed by a number of fully connected layers (e.g., 3) that are, in combination, configured and trained to classify images. Examples of neural networks configured as AlexNets are described in "ImageNet Classification with Deep Convolutional Neural Networks" by Krizhevsky et al., NIPS 2012, which is incorporated by reference as if fully set forth herein. The learning based defect classifiers described herein may be further configured as described in this reference.

In another embodiment, the learning based defect classifier is configured as a GoogleNet. A GoogleNet may include layers such as convolutional, pooling, and fully connected layers configured and trained to classify images. While the GoogleNet architecture may include a relatively high number of layers (especially compared to some other neural networks described herein), some of the layers may be operating in parallel, and groups of layers that function in parallel with each other are generally referred to as inception modules. Others of the layers may operate sequentially. Therefore, a GoogleNet is different from other neural networks described herein in that not all of the layers are arranged in a sequential structure. Examples of neural networks configured as GoogleNets are described in "Going Deeper with Convolutions," by Szegedy et al., CVPR 2015, which is incorporated by reference as if fully set forth herein. The learning based defect classifiers described herein may be further configured as described in this reference.

In a further embodiment, the learning based defect classifier is configured as a VGG network. VGG networks were created by increasing the number of convolutional layers while fixing other parameters of the architecture. Adding convolutional layers to increase depth is made possible by using substantially small convolutional filters in all of the layers. Like the other neural networks described herein, VGG networks were created and trained to classify images. VGG networks also include convolutional layers followed by fully connected layers. Examples of neural networks configured as VGG are described in "Very Deep Convolutional Networks for Large-Scale Image Recognition," by Simonyan et al., ICLR 2015, which is incorporated by reference as if fully set forth herein. The learning based defect classifiers described herein may be further configured as described in this reference.

In some embodiments, the learning based defect classifier is configured as a deep residual network or a Deep Residual Net Like some other learning based defect classifiers described herein, a deep residual network may include convolutional layers followed by fully connected layers, which are, in combination, configured and trained for image classification. In a deep residual network, the layers are configured to learn residual functions with reference to the layer inputs, instead of learning unreferenced functions. In particular, instead of hoping each few stacked layers directly fit a desired underlying mapping, these layers are explicitly allowed to fit a residual mapping, which is realized by feedforward neural networks with shortcut connections. Shortcut connections are connections that skip one or more layers. A deep residual net may be created by taking a plain neural network structure that includes convolutional layers and inserting shortcut connections which thereby takes the plain neural network and turns it into its residual learning counterpart. Examples of deep residual nets are described in "Deep Residual Learning for Image Recognition" by He et al., NIPS 2015, which is incorporated by reference as if fully set forth herein. The learning based defect classifiers described herein may be further configured as described in this reference.

The convolutional layer(s) included in the first portion of the learning based defect classifier may have any suitable configuration known in the art and are generally configured to determine features for an image as a function of position across the image (i.e., a feature map) by applying a convolution function to the input image using one or more filters. In this manner, a part of the learning based defect classifier may be configured as a convolution neural network (CNN). For example, the first portion of the learning based defect classifier may be configured as a CNN, which is usually stacks of convolution and pooling layers, to extract local features. The embodiments described herein can take advantage of deep learning concepts such as a CNN to solve the normally intractable representation inversion problem. The first portion may have any CNN configuration or architecture known in the art. The one or more pooling layers may also have any suitable configuration known in the art (e.g., max pooling layers) and are generally configured for reducing the dimensionality of the feature map generated by the one or more convolutional layers while retaining the most important features.

The features determined by the first portion of the learning based defect classifier may include any suitable features described further herein or known in the art that can be inferred from the input and used to generate the output described further herein. For example, the features may include a vector of intensity values per pixel. The features may also include vectors of scalar values, vectors of independent distributions, joint distributions, or any other suitable feature types known in the art.

The one or more fully connected layers are configured for selecting one or more of the determined features and classifying the defects based on the one or more selected features. A "fully connected layer" may be generally defined as a layer in which each of the nodes is connected to each of the nodes in the previous layer. The fully connected layer(s) select features from feature map 608 and then classify the defects based on the selected features. The selected features may include all of the features in the feature map (if appropriate) or only some of the features in the feature map. The learning based defect classifier outputs classification 612, which may include a classification result per defect with a confidence associated with each classification result. The results of the classification can also be used as described further herein. The classification may have any suitable format (such as a defect ID, a defect description such as "pattern," "bridge," etc.). The classification results may be stored and used as described further herein.

FIG. 6 shows the defect classifier architecture in a fully trained mode (i.e., the learning based defect classifier has already been trained) with the inputs that may be provided to the learning based defect classifier for runtime or production mode. The embodiments described herein may or may not be configured for training the learning based defect classifier. Examples of how the learning based defect classifier may be trained can be found in commonly assigned U.S. patent application Ser. No. 15/697,426 filed Sep. 6, 2017 by He et al., which is incorporated by reference as if fully set forth herein. The embodiments described herein may be further configured as described in this patent application.

Unlike the training methods described in the above-referenced patent application, however, the learning based defect classifier described herein is preferably trained with the added metrology attributes. Except for the addition of the metrology data based defect level attributes into the training data, this training and/or tuning can be performed exactly the same way as today. In this manner, after auto-labeling, no change or additional effort in the training process is needed.

Furthermore, there is advantageously no need to figure out which of the metrology data based defect level attributes are useful or not. In particular, some sources of noise, e.g., random LER and CD non-uniformity, are understood in principle to contribute to wafer-level noise due to the fact that defect detection generally includes subtraction of images of structures that are supposed to look identical. However, a significant advantage of the embodiments described herein is that we can simply feed these measurements as additional defect attributes and the machine learning algorithms learn which measurements help with DOI-nuisance separation and how. If one or more of the metrology data based defect level attributes are not useful, the learning based defect classifier will learn to ignore these defect attributes during the training. For example, during set up time, the learning based defect classifiers described herein will be provided with examples of DOIs and nuisances in a training set. The learning based defect classifier figures out the best ways to separate the defect types based on the training set; hence, the idea of adding metrology "attributes" to give it another source of information to optimize the separability and/or adjust to process variations that are reflected in the metrology data. In this manner, any and all available metrology data based defect attributes determined as described herein can be fed into the defect classifier, and the defect classifier can learn which defect attributes are suitable for identifying the nuisances and the DOIs.

The computer subsystem(s) described herein may be further configured for single image detection as described in U.S. Patent Application Publication No. 2017/0140524 published May 18, 2017 by Karsenti et al., which is incorporated by reference as if fully set forth herein. The embodiments described herein may be further configured for performing transformations (from an input image to a simulated image) such as those described in commonly owned U.S. Patent Application Publication Nos. 2017/0140524 published May 18, 2017 by Karsenti et al., 2017/0148226 published May 25, 2017 by Zhang et al., 2017/0193400 published Jul. 6, 2017 by Bhaskar et al., 2017/0193680 published Jul. 6, 2017 by Zhang et al., 2017/0194126 published Jul. 6, 2017 by Bhaskar et al., 2017/0200260 published Jul. 13, 2017 by Bhaskar et al., 2017/0200264 published Jul. 13, 2017 by Park et al., 2017/0200265 published Jul. 13, 2017 by Bhaskar et al., and 2017/0345140 published Nov. 30, 2017 by Zhang et al., which are incorporated by reference as if fully set forth herein. The embodiments described herein may be further configured as described in these patent application publications. In addition, the embodiments described herein may be configured to perform any steps described in these patent application publications.

Each of the embodiments of the system may be further configured according to any other embodiment(s) described herein.

Another embodiment relates to a computer-implemented method for identifying nuisances and DOIs in defects detected on a wafer. The method includes steps for each of the functions of the computer subsystem(s) described above. The inspection subsystem is configured as described herein.

Each of the steps of the method may be performed as described further herein. The method may also include any other step(s) that can be performed by the inspection subsystem, computer subsystem(s), metrology tool, and/or system(s) described herein. The steps of the method are performed by one or more computer subsystems, which may be configured according to any of the embodiments described herein. In addition, the method described above may be performed by any of the system embodiments described herein.

Figure 7:
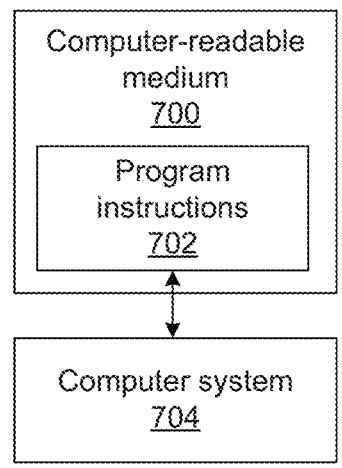
FIG. 7 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for identifying nuisances and DOIs in defects detected on a wafer. One such embodiment is shown in FIG. 7. In particular, as shown in FIG. 7, non-transitory computer-readable medium 700 includes program instructions 702 executable on computer system 704. The computer-implemented method may include any step(s) of any method(s) described herein.

Program instructions 702 implementing methods such as those described herein may be stored on computer-readable medium 700. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, Java-Beans, Microsoft Foundation Classes ("MFC"), SSE (Streaming SIMD Extension) or other technologies or methodologies, as desired.

Computer system 704 may be configured according to any of the embodiments described herein.

Further modifications and alternative embodiments of various aspects of the invention will be apparent to those skilled in the art in view of this description. For example, methods and systems for identifying nuisances and defects of interest in defects detected on a wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to identify nuisances and defects of interest in defects detected on a wafer, comprising:
   an inspection subsystem comprising at least an energy source and a detector, wherein the energy source is configured to generate energy that is directed to a wafer, and wherein the detector is configured to detect energy from the wafer and to generate output responsive to the detected energy; and
   one or more computer subsystems configured for:
      detecting defects on the wafer by applying a defect detection method to the output;
      acquiring metrology data for the wafer, wherein the metrology data is generated for the water by a metrology tool that performs measurements on the wafer at an array of measurement points on the wafer, and wherein a density of the measurement points on the wafer is less than a density of inspection points on the wafer at which the output is generated by the detector during inspection of the wafer;
      determining locations of the defects on the wafer with respect to locations of the measurement points on the wafer;
      assigning metrology data to the defects as a defect attribute based on the locations of the defects determined with respect to the locations of the measurement points, wherein said assigning comprises:
         for the defects detected at the measurement points, assigning the acquired metrology data generated at the measurement points to the defects based on which of the measurement points at which the defects were detected; and
         for the defects not detected at any of the measurement points, predicting the metrology data at locations at which the defects were detected from the metrology data generated at the measurement points and the locations of the defects determined with respect to the locations of the measurement points; and
      determining if the defects are nuisances or defects of interest based on the defect attributes assigned to the defects.

2. The system of claim 1, wherein the metrology tool generates the metrology data for the wafer prior to said detecting defects.

3. The system of claim 1, wherein the measurement points are determined prior to said detecting defects and independently of the defects detected on the wafer.

4. The system of claim 1, wherein at least some values of the metrology data generated by the metrology tool are below a resolution limit of the inspection subsystem.

5. The system of claim 1, wherein the density of the measurement points is selected to capture wafer level variations in the metrology data.

6. The system of claim 1, wherein the density of the measurement points is selected to capture die level variations in the metrology data.

7. The system of claim 1, wherein the metrology data is responsive to characteristics of the wafer that contribute to noise in the output generated by the detector for the wafer, and wherein determining if the defects are the nuisances or the defects of interest based on the defect attributes reduces instability of the inspection due to the noise.

8. The system of claim 7, wherein the noise comprises wafer level noise.

9. The system of claim 7, wherein the noise comprises wafer-to-wafer noise.

10. The system of claim 1, wherein the metrology data comprises one or more of film thickness, patterned structure profile, critical dimension, line edge roughness, and line width roughness.

11. The system of claim 1, wherein said predicting comprises interpolation of the acquired metrology data from the measurement points to the locations of the defects determined with respect to the locations of the measurement points.

12. The system of claim 1, wherein said predicting comprises extrapolation of the acquired metrology data from the measurement points to the locations of the defects determined with respect to the locations of the measurement points.

13. The system of claim 1, wherein the defect detection method comprises subtracting the output for reference locations on the wafer from the output for target locations on the wafer corresponding to the reference locations, wherein the one or more computer subsystems are further configured for determining locations of the reference locations with respect to the locations of the measurement points on the wafer, and wherein assigning the metrology data to the defects as the defect attribute further comprises:

assigning the metrology data to the reference locations as a reference attribute based on the locations of the reference locations determined with respect to the locations of the measurement points, wherein said assigning the metrology data to the reference locations comprises:

for the reference locations located at the measurement points, assigning the acquired metrology data generated at the measurement points to the reference locations based on which of the measurement points at which the reference locations are located; and for the reference locations not located at any of the measurement points, predicting the metrology data at the reference locations from the metrology data generated at the measurement points and the locations of the reference locations determined with respect to the locations of the measurement points; and determining the defect attribute for one of the defects detected at one of the target locations by subtracting the reference attribute assigned to one of the reference locations, the output for which was subtracted from the one of the target locations in the defect detection method, from the metrology data assigned to the one of the defects.

14. The system of claim 1, wherein the one or more computer subsystems are further configured for generating additional data from the acquired metrology data as a function of the measurement points on the wafer, assigning the additional data to the defects as another defect attribute based on the locations of the defects determined with respect to the locations of the measurement points, wherein assigning the additional data comprises: for the defects detected at the measurement points, assigning the additional data at the measurement points to the defects based on which of the measurement points at which the defects were detected; and for the defects not detected at any of the measurement points, predicting the additional data at the locations at which the defects were detected from the additional data at the measurement points and the locations of the defects determined with respect to the locations of the measurement points.

15. The system of claim 14, wherein determining if the defects are the nuisances or the defects of interest is further performed based on the defect attributes and the other defect attributes assigned to the defects.

16. The system of claim 1, wherein determining if the defects are the nuisances or the defects of interest is further performed based on the defect attributes assigned to the defects and one or more other defect attributes determined for the defects by the one or more computer subsystems based on the output generated by the detector.

17. The system of claim 1, wherein determining if the defects are the nuisances or the defects of interest comprises inputting the defect attributes to a learning based defect classifier.

18. The system of claim 1, wherein determining the locations of the defects, assigning the metrology data, and determining if the defects are the nuisances or the defects of interest are performed while the inspection subsystem directs the energy to the wafer and the detector generates the output responsive to the detected energy.

19. The system of claim 1, wherein assigning the metrology data and determining if the defects are the nuisances or the defects of interest are performed after all of the defects are detected on the wafer.

20. The system of claim 1, wherein the one or more computer subsystems are further configured for separating the nuisances from the defects of interest in inspection results generated for the wafer by the one or more computer subsystems.

21. The system of claim 1, wherein the inspection subsystem is configured as an optical inspection subsystem.

22. The system of claim 1, wherein the inspection subsystem is configured as an electron beam inspection system.

23. The system of claim 1, wherein the metrology tool is not included in the system.

24. The system of claim 1, wherein the metrology tool is incorporated into the system such that the inspection subsystem and the metrology tool share one or more common elements of the system.

25. A non-transitory computer-readable medium, storing program instructions executable on a computer system for performing a computer-implemented method for identifying nuisances and defects of interest in defects detected on a wafer, wherein the computer-implemented method comprises:
- detecting defects on the wafer by applying a defect detection method to output generated for the wafer by a detector of an inspection subsystem, wherein the inspection subsystem comprises at least an energy source and the detector, wherein the energy source is configured to generate energy that is directed to the wafer, and wherein the detector is configured to detect energy from the wafer and to generate the output responsive to the detected energy;
- acquiring metrology data for the wafer, wherein the metrology data is generated for the wafer by a metrology tool that performs measurements on the wafer at an array of measurement points on the wafer, and wherein a density of the measurement points on the wafer is less than a density of inspection points on the wafer at which the output is generated by the detector during inspection of the wafer;
- determining locations of the defects on the wafer with respect to locations of the measurement points on the wafer;
- assigning metrology data to the defects as a defect attribute based on the locations of the defects determined with respect to the locations of the measurement points, wherein said assigning comprises:
  - for the defects detected at the measurement points, assigning the acquired metrology data generated at the measurement points to the defects based on which of the measurement points at which the defects were detected; and
  - for the defects not detected at any of the measurement points, predicting the metrology data at locations at which the defects were detected from the metrology data generated at the measurement points and the locations of the defects determined with respect to the locations of the measurement points; and
- determining if the defects are nuisances or defects of interest based on the defect attributes assigned to the defects.

26. A computer-implemented method for identifying nuisances and defects of interest in defects detected on a wafer, comprising:
- detecting defects on the wafer by applying a defect detection method to output generated for the wafer by a detector of an inspection subsystem, wherein the inspection subsystem comprises at least an energy source and the detector, wherein the energy source is configured to generate energy that is directed to the wafer, and wherein the detector is configured to detect energy from the wafer and to generate the output responsive to the detected energy;
- acquiring metrology data for the wafer, wherein the metrology data is generated for the wafer by a metrology tool that performs measurements on the wafer at an array of measurement points on the wafer, and Wherein a density of the measurement points on the wafer is less than a density of inspection points on the wafer at which the output is generated by the detector during inspection of the wafer;
- determining locations of the defects on the wafer with respect to locations of the measurement points on the wafer;
- assigning metrology data to the defects as a defect attribute based on the locations of the defects determined with respect to the locations of the measurement points, wherein said assigning comprises:
  - for the defects detected at the measurement points, assigning the acquired metrology data generated at the measurement points to the defects based on which of the measurement points at which the defects were detected; and
  - for the defects not detected at any of the measurement points, predicting the metrology data at locations at which the defects were detected from the metrology data generated at the measurement points and the locations of the defects determined with respect to the locations of the measurement points; and
- determining if the defects are nuisances or defects of interest based on the defect attributes assigned to the defects, wherein said detecting, said acquiring, said determining the locations, said assigning, and said determining if the defects are nuisances or defects of interest are performed by one or more computer subsystems coupled to the inspection subsystem.

* * * * *